(12) United States Patent
May et al.

(10) Patent No.: US 7,546,424 B1
(45) Date of Patent: Jun. 9, 2009

(54) EMBEDDED PROCESSOR WITH DUAL-PORT SRAM FOR PROGRAMMABLE LOGIC

(75) Inventors: Roger May, Bicester (GB); Andrew Draper, Bucks (GB); Paul Metzgen, Middlesex (GB); Neil Thorne, London (GB)

(73) Assignee: Altera Corporation, San Jose, CA (US)

( * ) Notice: Subject to any disclaimer, the term of this patent is extended or adjusted under 35 U.S.C. 154(b) by 126 days.

(21) Appl. No.: 11/445,703

(22) Filed: Jun. 2, 2006

Related U.S. Application Data

(62) Division of application No. 09/881,226, filed on Jun. 12, 2001, now Pat. No. 7,096,324.

(60) Provisional application No. 60/211,094, filed on Jun. 12, 2000.

(51) Int. Cl.
*G06F 12/00* (2006.01)

(52) U.S. Cl. .......................... 711/149; 711/5; 711/100; 711/148; 711/151; 711/152; 711/163; 711/164; 365/185.04; 365/185.29; 365/185.33; 365/195

(58) Field of Classification Search ......... 711/147–149, 711/5, 100, 151–152, 163–164; 365/185.04, 365/185.29, 185.33, 195
See application file for complete search history.

(56) References Cited

U.S. PATENT DOCUMENTS

| | | | |
|---|---|---|---|
| 5,276,842 A | | 1/1994 | Sugita |
| 5,301,247 A * | | 4/1994 | Rasmussen et al. ........... 380/43 |
| 5,418,938 A | | 5/1995 | Hatanaka et al. |
| 5,442,755 A * | | 8/1995 | Shibata ........................ 710/108 |
| 5,559,986 A * | | 9/1996 | Alpert et al. ................. 711/144 |
| 5,617,531 A * | | 4/1997 | Crouch et al. ................. 714/30 |
| 5,644,756 A | | 7/1997 | Harwood |
| 5,828,825 A * | | 10/1998 | Eskandari et al. ............. 714/27 |
| 5,920,504 A * | | 7/1999 | Lee et al. ............... 365/185.11 |
| 5,953,738 A | | 9/1999 | Rao |
| 6,026,016 A * | | 2/2000 | Gafken .................. 365/185.04 |
| 6,191,998 B1 | | 2/2001 | Reddy et al. |
| 6,212,607 B1 * | | 4/2001 | Miller et al. ................. 711/149 |

(Continued)

*Primary Examiner*—Tuan V Thai
*Assistant Examiner*—Zhuo H Li
(74) *Attorney, Agent, or Firm*—Townsend and Townsend and Crew LLP; J. Matthew Zigmant

(57) ABSTRACT

Methods and apparatus for programmable logic devices including embedded processors having a dual-port SRAMs. A programmable logic integrated circuit includes a programmable logic portion having a plurality of logic elements, programmably configurable to implement user-defined combinatorial or registered logic functions, and an embedded processor portion coupled to the programmable logic portion. The embedded processor portion includes a processor, and a memory block coupled to the processor. The memory block includes a first plurality of memory cells for storing data, a second plurality of memory cells for storing data, a first port coupled to the first and second pluralities of memory cells, a second port coupled to the first and second pluralities of memory cells, and an arbiter coupled to the first port and the second port. When the second port is accessing the first plurality of memory cells, the arbiter prevents the first port from accessing the first plurality of memory cells, and when the second port is accessing the first plurality of memory cells, the arbiter allows the first port to access the second plurality of memory cells.

24 Claims, 21 Drawing Sheets

U.S. PATENT DOCUMENTS

| | | |
|---|---|---|
| 6,246,634 B1 | 6/2001 | Nojima |
| 6,457,177 B1 | 9/2002 | Reams |
| 6,467,009 B1 | 10/2002 | Winegarden et al. |
| 6,496,887 B1 | 12/2002 | Plants |
| 6,499,089 B1 | 12/2002 | Phelan et al. |
| 6,567,426 B1 | 5/2003 | van Hook et al. |
| 7,096,324 B1 * | 8/2006 | May et al. .................. 711/149 |

* cited by examiner

EMBEDDED PROCESSOR WITH DUAL-PORT SRAM FOR PROGRAMMABLE LOGIC

CROSS-REFERENCES TO RELATED APPLICATIONS

This application is a continuation of U.S. patent application Ser. No. 09/881,226, filed Jun. 12, 2001, which claims the benefit of U.S. provisional patent application 60/211,094, filed Jun. 12, 2000, which are incorporated by reference along with all other documents listed in this application.

BACKGROUND

The present invention relates to the field of integrated circuits and in particular, to a system on a programmable chip (SOPC) architecture where programmable logic and an embedded processor are incorporated in a single programmable logic integrated circuit to provide greater functionality and performance.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables. Programmable logic integrated circuits also included embedded user-programmable memory or RAM.

Despite the success of programmable logic, there is a continuing desire to provide greater functionality in a programmable logic integrated circuit, but at the same time, provide greater performance. The programmable logic of a programmable logic integrated circuit may be configured to emulate a processor, such as an Intel microprocessor or other central processing unit (CPU). However, when a processor implemented in programmable logic, that programmable logic cannot be used for other purposes, and also the performance of a hardware-implemented processor is still greater. Incorporating an embedded processor within a programmable logic integrated circuit will provide users with greater functionality and allow functionality not available when only programmable logic is available.

Therefore, there is a need to provide a programmable logic integrated circuit having an embedded processor.

SUMMARY

Embodiments of the present invention provide methods and apparatus for programmable logic devices including embedded processors having dual-port SRAMs. The dual-port SRAMs may be accessed by both an embedded processor portion and a programmable logic portion. Access to the embedded processor port may be multiplexed between two or more bus interfaces. Access to the memory by the two ports may be controlled by an arbiter. In an embodiment, the arbiter allows one port to lock out the other. In a further embodiment, the arbiter allows one port to lock access to a portion of the memory.

An exemplary embodiment provides a programmable logic integrated circuit including a programmable logic portion and an embedded processor portion. The embedded processor portion includes a processor and a memory block which has a memory having a first port and a second port, as well as an arbiter. The arbiter arbitrates access to the memory by the first port and the second port.

A further exemplary embodiment of the present invention provides a programmable logic integrated circuit. This integrated circuit includes a programmable logic portion having a plurality of logic elements, programmably configurable to implement user-defined combinatorial or registered logic functions, and an embedded processor portion coupled to the programmable logic portion. The embedded processor portion includes a processor, and a memory block coupled to the processor. The memory block includes a first plurality of memory cells for storing data, a second plurality of memory cells for storing data, a first port coupled to the first and second pluralities of memory cells, a second port coupled to the first and second pluralities of memory cells, and an arbiter coupled to the first port and the second port. When the second port is accessing the first plurality of memory cells, the arbiter prevents the first port from accessing the first plurality of memory cells, and when the second port is accessing the first plurality of memory cells, the arbiter allows the first port to access the second plurality of memory cells.

A further exemplary embodiment provides a method of arbitration in a programmable logic integrated circuit. The programmable logic integrated circuit includes a programmable logic portion coupled to an embedded processor portion. The embedded processor portion includes a memory coupled to an arbiter and having a first port and a second port. The method itself includes sending a lock request to the arbiter when the second port is to access the memory, sending a lock grant from the arbiter if the first port is not accessing the memory, and not sending a lock grant from the arbiter if the first port is accessing the memory.

Yet a further exemplary embodiment provides a method of arbitration in a programmable logic integrated circuit. The integrated circuit includes a programmable logic portion coupled to an embedded processor portion, and the embedded processor portion has a memory coupled to an arbiter. The memory includes a plurality of memory cells, a first port coupled to the plurality of memory cells, and a second port coupled to the plurality of memory cells. The method itself includes defining a first plurality of memory cells in the plurality of memory cells by storing a value in a lock register.

Another exemplary embodiment provides a method of laying out a programmable logic device having an embedded processor. The method includes providing a layout of a programmable logic device, the programmable logic device having four sides, stretching one side of the programmable logic device, such that an open space is created, placing the layout of an embedded processor in the open space. The embedded processor includes a memory having a first port and a second port, and an arbiter coupled to the first port and the second port.

Another exemplary embodiment provides a method of laying out a programmable logic device having an embedded processor. This method includes providing a layout of a programmable logic device, the programmable logic device having four sides stretching one side of the programmable logic device, such that an open portion of the layout is created, laying out an embedded processor in the open portion of the layout. The embedded processor has a dual port memory and an arbiter, and the arbiter arbitrates access to the dual port memory.

A further exemplary embodiment provides a programmable logic integrated circuit. The integrated circuit includes a programmable logic portion having a plurality of logic elements, programmably configurable to implement user-defined combinatorial or registered logic functions, and an embedded processor portion coupled to the programmable logic portion. The embedded processor portion includes a processor, a first bus coupled to the processor, a memory coupled to the first bus and the programmable logic portion, and a second bus coupled to the memory.

Yet a further exemplary embodiment of the present invention provides a programmable logic integrated circuit. The integrated circuit includes a programmable logic portion having a plurality of logic elements, programmably configurable to implement user-defined combinatorial or registered logic functions, and an embedded processor portion coupled to the programmable logic portion. The embedded processor portion includes a plurality of memory cells, a first port coupled to the plurality of memory cells, a second port coupled to the plurality of memory cells, and a multiplexer coupled to the first port. Also included are an arbiter coupled to the first port, the second port, and the multiplexer, and a lock register to store a user-defined lock size and coupled to the arbiter. The user-defined lock size defines a lockable portion of the plurality of memory cells, and a non-lockable portion of the plurality of memory cells.

A further embodiment provides an embedded processor. The embedded processor includes a plurality of memory cells, a first port coupled to the plurality of memory cells, a second port coupled to the plurality of memory cells, and a multiplexer coupled to the first port. Also included are a first bus coupled to the multiplexer, a second bus coupled to the multiplexer, and a processor coupled to the first bus.

A better understanding of the nature and advantages of the present invention may be gained with reference to the following detailed description and the accompanying drawings.

DESCRIPTION OF EXEMPLARY EMBODIMENTS

Figure 1:
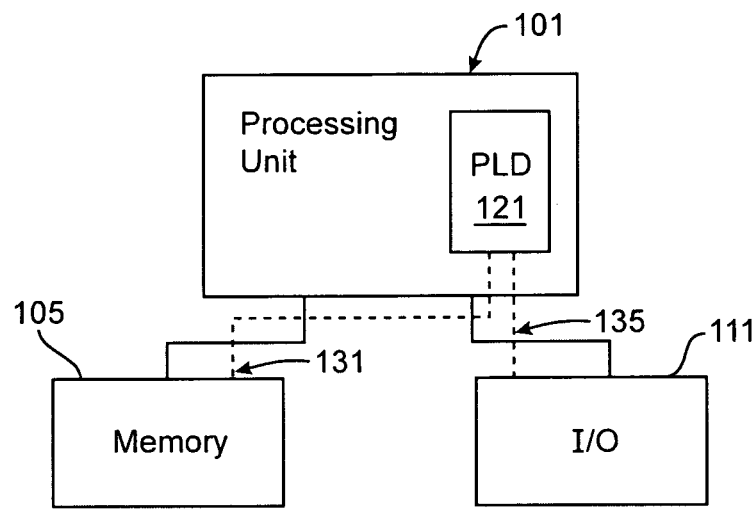
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258,668, 5,260,610, 5,260,611, 5,436,575, and the Altera Data Book (1999), all incorporated by reference in their entirety for all purposes. Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
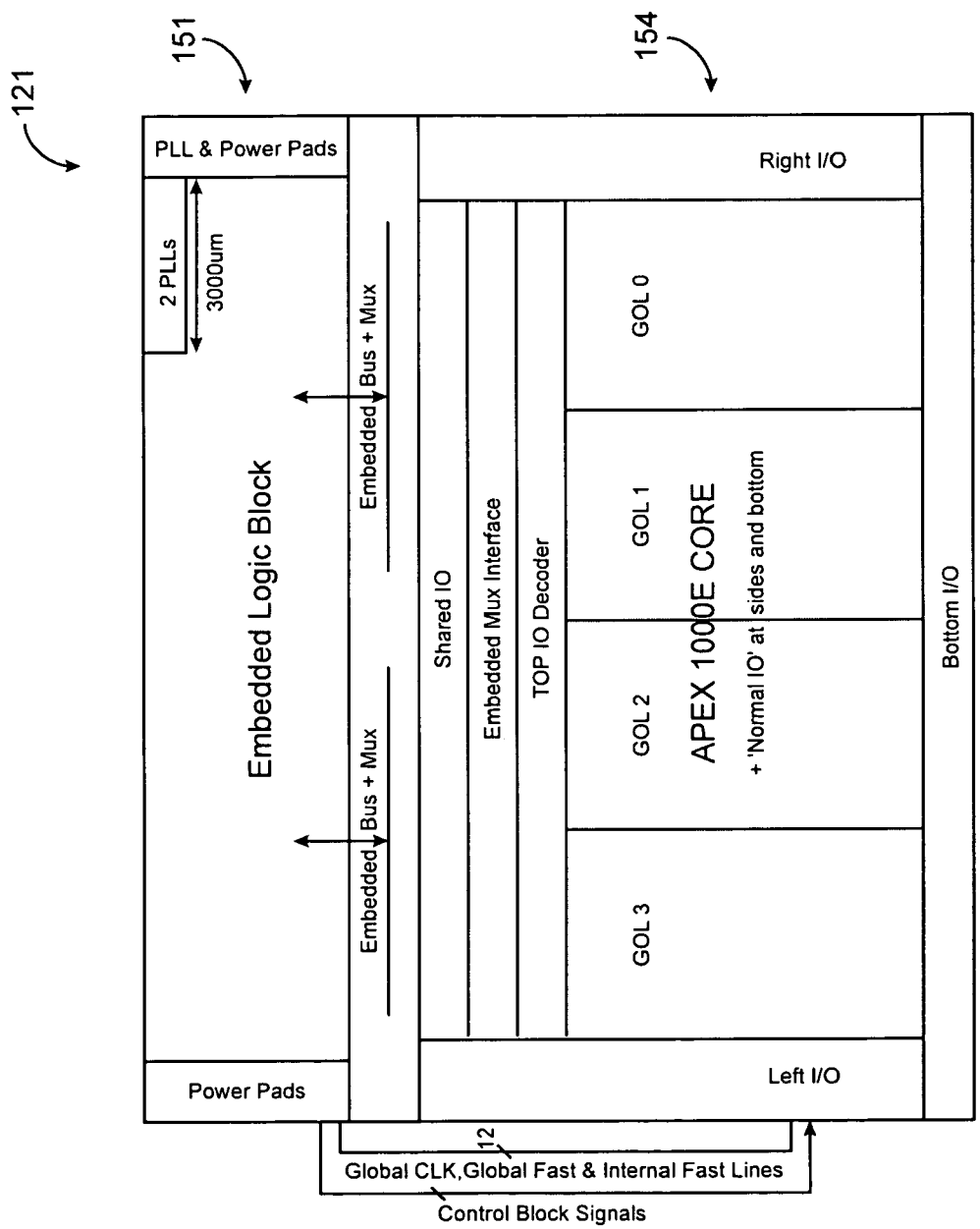
FIG. 2 is a diagram showing a floor plan of a programmable logic integrated circuit with an embedded processor.

FIG. 2 is a diagram showing a floorplan architecture or layout of a programmable logic integrated circuit with an embedded processor. In an aspect of the invention, an integrated circuit includes on the same semiconductor substrate, programmable logic and an embedded processor core. The integrated circuit provides a system on a programmable chip (SOPC) architecture. The PLD integrated circuit 121 includes a embedded logic block portion 151 and programmable logic portion 154. The embedded logic block is the portion of the integrated circuit containing an on-chip or embedded processor core. This embedded processor portion may also be referred to as a "stripe" because it occupies a stripe along an entire edge of the layout of the chip; this stripe is adjacent to the programmable logic portion. In the embodiment of FIG. 2, the stripe is located along one edge of the integrated circuit. In other embodiments, the embedded processor portion may be organized in a shape other than a stripe, and may not run the entire length of the integrated circuit. Further, the embedded processor portion may not be positioned along an edge of the integrated circuit, but may be within or internal to the integrated circuit. For example, in a specific embodiment, the processor portion may be totally enclosed within the programmable logic portion.

In brief, the embedded processor core portion of the integrated circuit includes an on-chip RAM section, ARM or MIPS CPU (central processing unit) section, cache section (for the CPU), external bus interface section, and a universal asynchronous receiver-transistor (UART) section. The CPU section has a JTAG/debug external interface. The external bus interface can interface to external devices. The UART can interface with a serial port and facilitate asynchronous serial communication. In other embodiments of the invention, the integrated circuit may also support universal serial bus (USB) communication or IEEE 1394 communication (also known as FireWire), or both. In a specific embodiment, the CPU is an ARM922T 32-bit RISC processor core. In other embodiments, the CPU may be a MIPS core such as the MIPS32 4Kc 32-bit RISC processor core. The embedded processor core portion is positioned above the top I/Os of the programmable logic portion. The programmable logic portion has I/Os in a ring around it, including right and left I/Os and bottom I/O. The top I/Os are referred to as shared I/Os because these are I/Os that are shared by both the processor and programmable logic of the integrated circuit. In other words, either the processor or programmable logic portions may input data or output data, or both, using the shared I/Os.

The programmable logic portion of the integrated circuit may be sometimes referred to as the PLD portion of the integrated circuit because it contains the programmable logic of the integrated circuit. The programmable logic portion includes features that are discussed in more detail below. In a particular implementation, the programmable logic portion of the integrated circuit is similar to the APEX 20K architecture, and in particular the APEX 20K1000E (also know as the APEX1000E core) device. For the APEX20K architecture, the programmable logic is configured by programming SRAM memory cells, which are volatile memory cells. Volatile memory cells do not retain their stored state when power is removed. Therefore, these types of memory cells need to be reprogrammed upon power up of the chip. Other programmable logic integrated circuits use nonvolatile memory cells, such as floating gate cells or Flash cells. These programmable logic architectures may also be used to implement a programmable logic integrated circuit with embedded processor. Nonvolatile memory cells will not need to be reprogrammed upon power up since they retain their stored states even after power is removed.

One technique of implementing a programmable logic integrated circuit with embedded processor is to take an existing programmable logic integrated circuit design without an embedded processor stripe, and add this stripe to the layout. In other words, the programmable logic integrated circuit is stretched to include the stripe. Wiring is disconnected and reconnected in order so the processor and programmable logic portions may communicate with each other and the outside world. The entire integrated with the stripe is then fabricated.

Among the many advantages of this technique is that the programmable logic integrated circuit can be implemented relatively quickly without extensive modification to the programmable logic portion. The programmable logic portion is already debugged. There is software to configure the programmable logic. And users are already familiar with the architecture of the programmable logic portion. In certain embodiments, the stripe adds some die size, but does not require extra pads or pins. So the entire die with the stripe may still fit within the same package size as the original programmable-logic-only integrated circuit. A further advantage of this technique is that the stripe can be designed separately from the programmable logic. This stripe may be standardized and licensed or sold to programmable logic manufacturers so that they may more easily create a programmable logic integrated circuit with embedded processor.

Figure 3:
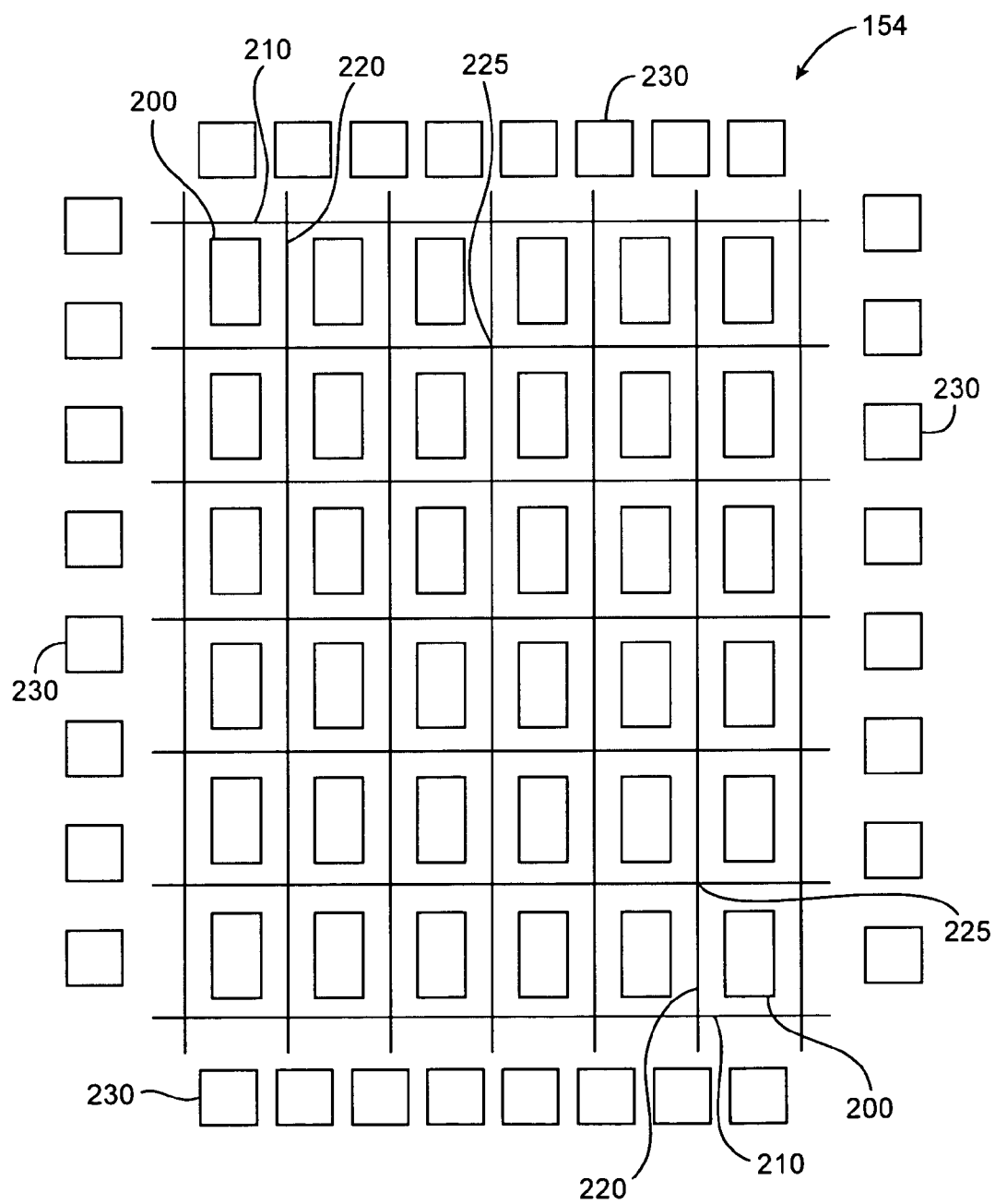
FIG. 3 is a diagram showing the programmable logic portion of the programmable logic integrated circuit.

FIG. 3 is a simplified block diagram of an overall internal architecture and organization of PLD portion 154 of FIG. 2. Many details of programmable logic architecture, organization, and circuit design are not necessary for an understanding of the present invention and such details are not shown in FIG. 3.

FIG. 3 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 4. The programmable logic portion may contain any arbitrary number of LABs, more or less than shown in PLD portion 154 of FIG. 3. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 3 further shows at the peripheries of the chip, input-output drivers 230. Input-output drivers 230 are for interfacing the PLD to external, off-chip circuitry. FIG. 3 shows thirty-two input-output drivers 230; however, a programmable logic integrated circuit may contain any number of input-output drivers, more or less than the number depicted. As discussed above, some of these input-output drivers may be shared between the embedded processor and programmable logic portions. Each input-output driver 230 is configurable for use as an input driver, output driver, or bidirectional driver. In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

Figure 4:
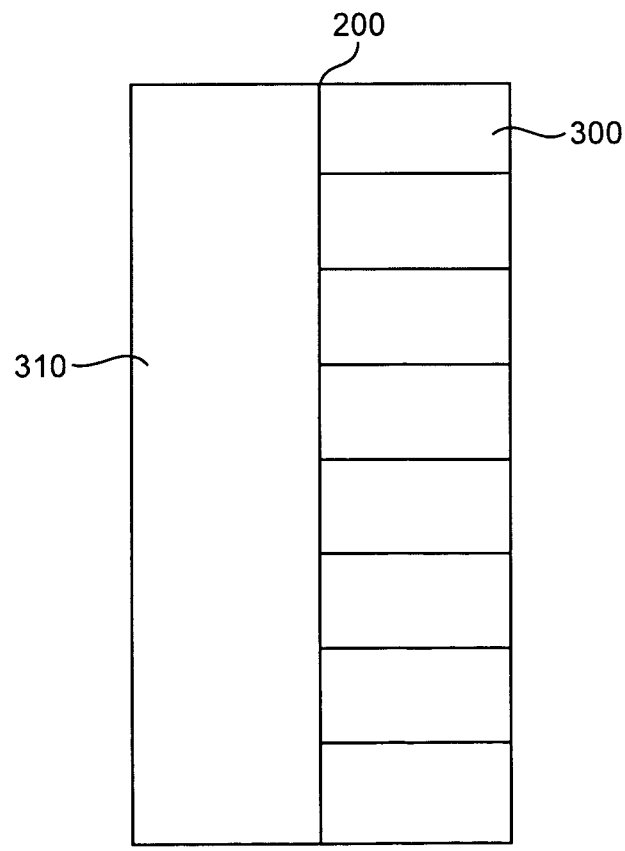
FIG. 4 is a simplified block diagram of a logic array block (LAB)

FIG. 4 shows a simplified block diagram of LAB 200 of FIG. 3. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 5:
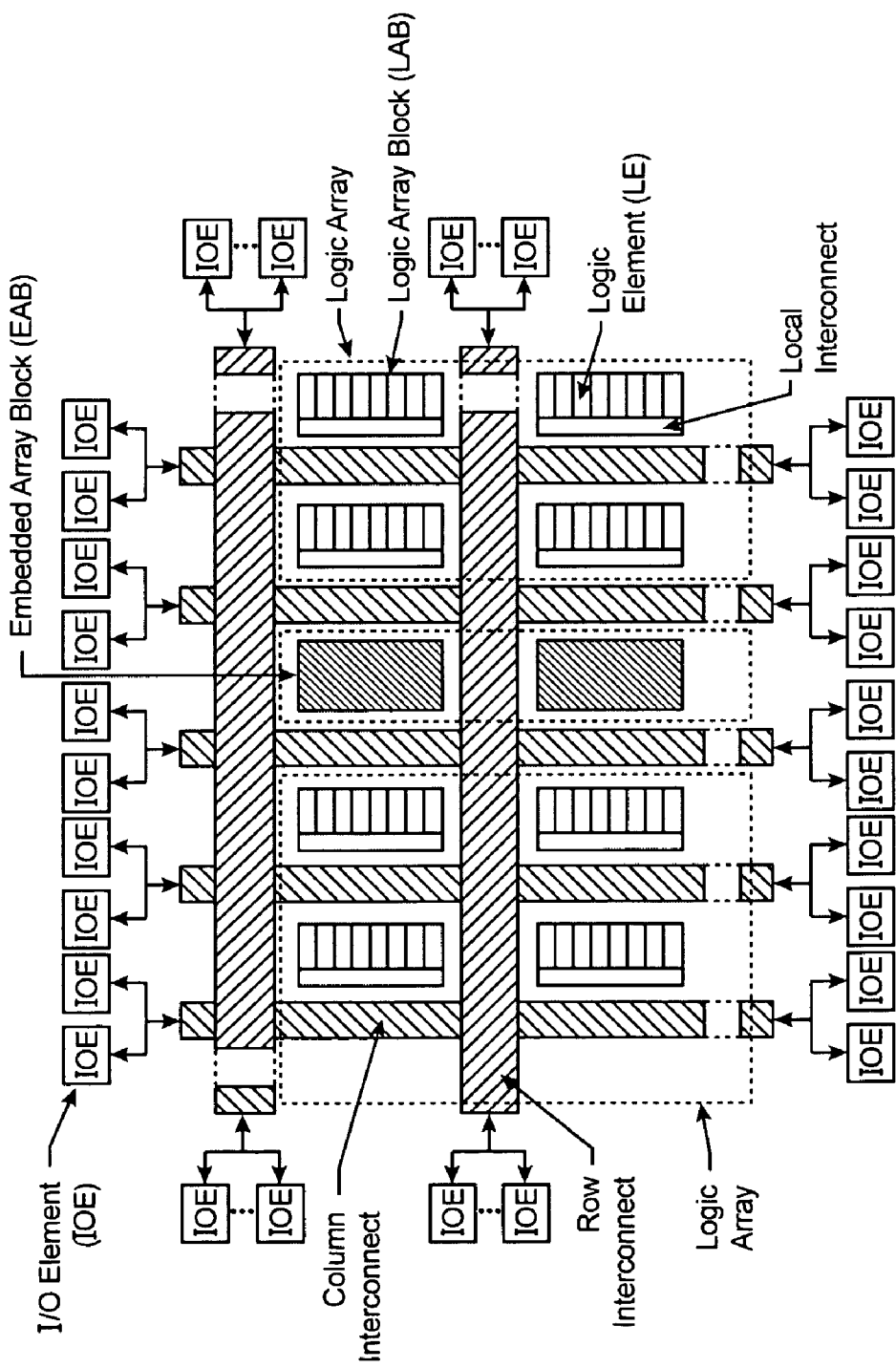
FIG. 5 shows an architecture of a programmable logic integrated circuit with embedded array blocks (EABs)

FIG. 5 shows a programmable logic architecture similar to that in FIG. 3. The architecture in FIG. 5 further includes embedded array blocks (EABs). EABs contain user memory, a flexible block of RAM. More discussion of this architecture may be found in the *Altera Data Book* (1999) in the description of the FLEX 10K product family and also in U.S. Pat. No. 5,550,782, which are incorporated by reference.

Figure 6:
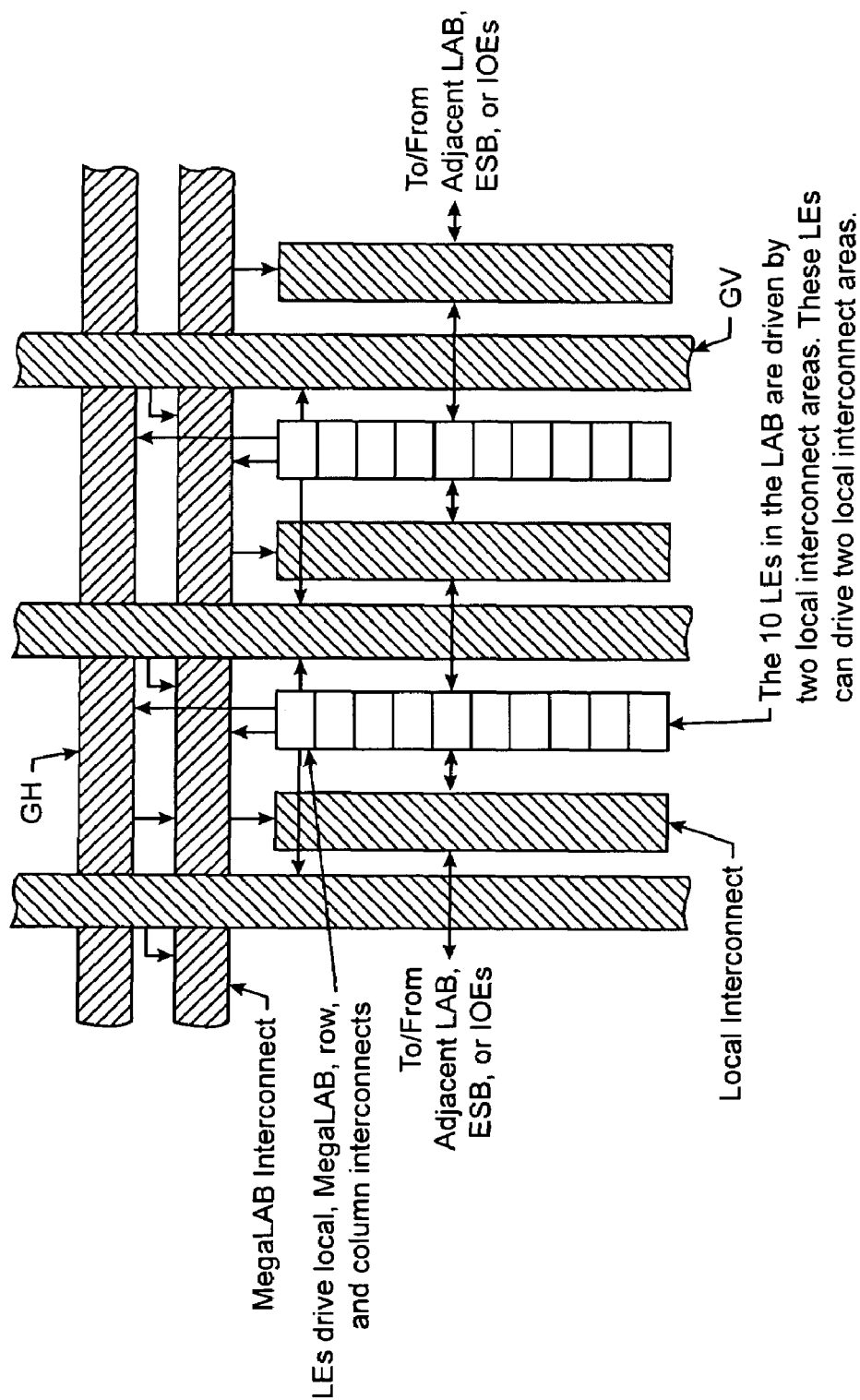
FIG. 6 shows an architecture of a programmable logic integrated circuit with megaLABs.

FIG. 6 shows a further embodiment of a programmable logic integrated circuit architecture. FIG. 6 only shows a portion of the architecture. The features shown in FIG. 6 are repeated horizontally and vertically as needed to create a PLD portion of any desired size. In this architecture, a number of LABs are grouped together into a megaLAB. In a specific embodiment, a megaLAB has sixteen LABs, each of which has ten LEs. There can be any number of megaLABs per PLD portion. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 3, this architecture has an additional level of interconnect, the megaLAB interconnect. Such an architecture is found in Altera's APEX™ family of products, which is described in detail in the *APEX 20K Programmable Logic Device Family Data Sheet* (November 1999), which is incorporated by reference. In a specific implementation, a megaLAB also includes an embedded system block (ESB) to implement a variety of memory functions such as CAM, RAM, dual-port RAM, ROM, and FIFO functions.

Figure 7:
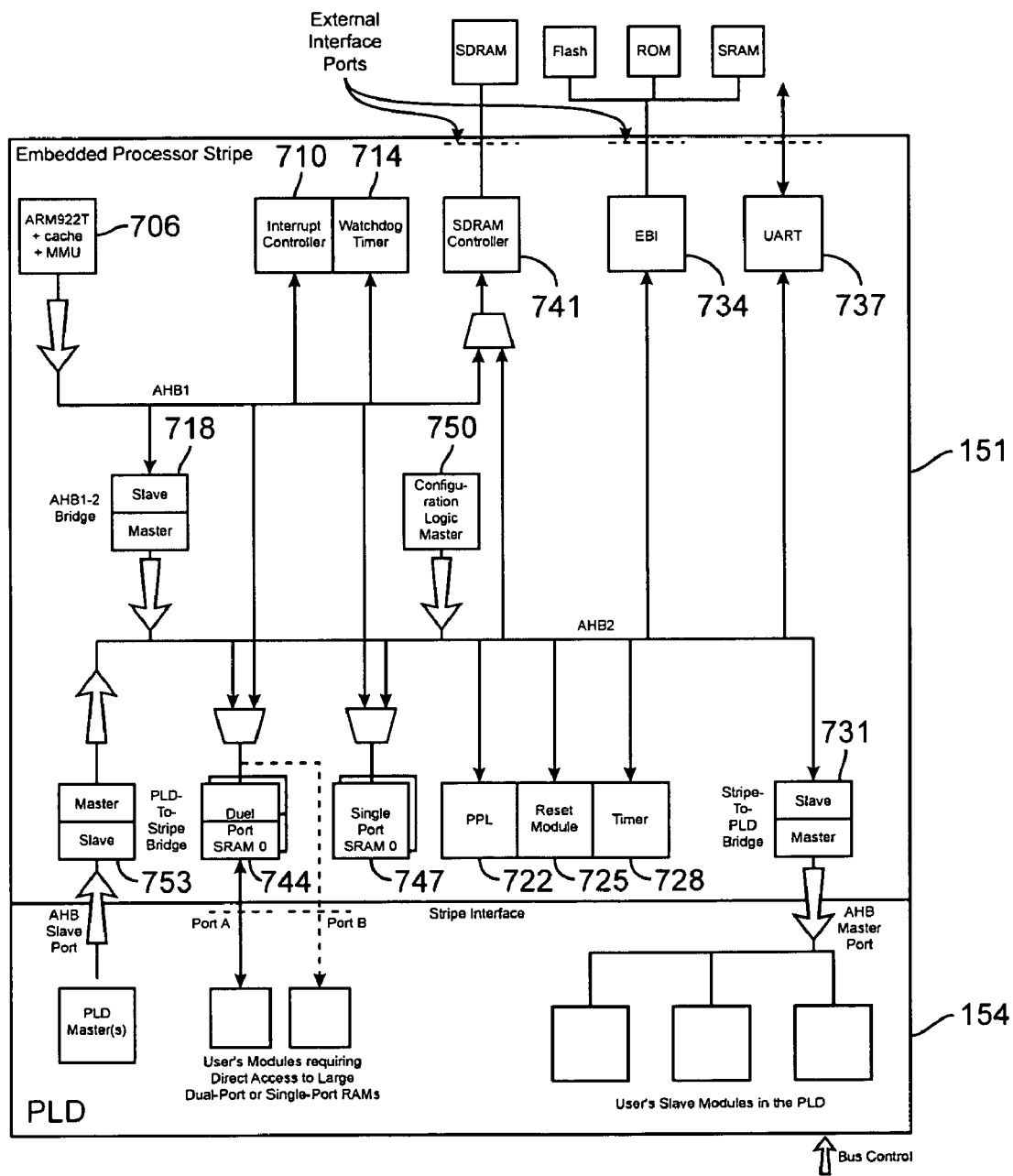
FIG. 7 shows a more detailed block diagram of the embedded processor stripe and the programmable logic portions of the integrated circuit.

FIG. 7 shows a more detailed block diagram of the embedded processor stripe portion 151, and also the programmable logic portion 154 of the integrated circuit. The embedded processor has two buses, AHB1 and AHB2. Two buses are used to ensure the processor 706 activity is unaffected by peripheral and memory operation. Three bidirectional AHB bridges enable the peripherals and programmable logic portion to exchange data with the embedded processor 706. Connected to AHB1 are the processor 706 (e.g., ARM922T), interrupt controller 710, watchdog timer 714, and AHB1-2 bridge 718. Connected to the AHB2 bus are a PLL 722, reset module 725, timer 725, stripe-to-PLD bridge 731, EBI (expansion bus interface) 734, and UART 737. An SDRAM controller 741, dual port SRAM0 744, single port SRAM0 747 are each accessible by either AHB1 or AHB2, selectable by using multiplexers. There are other logic circuits to control the functionality of the stripe including configuration logic master 750 and PLD-to-stripe bridge 753. Further discussion of the bus architecture for a programmable logic integrated circuit with embedded processor is in U.S. patent application Ser. No. 09/668,665, filed Sep. 22, 2000, which is incorporated by reference. Further discussion of additional features of the programmable logic integrated circuit with embedded processor may be found in U.S. patent application Ser. Nos. 09/668,704 and 09/668,202, both filed Sep. 22, 2000, which are incorporated by reference.

Figure 8:
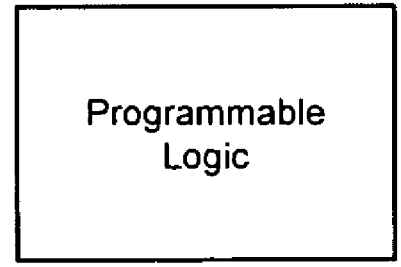
FIG. 8 shows a layout for a programmable logic integrated circuit without an embedded processor portion.
Figure 9:
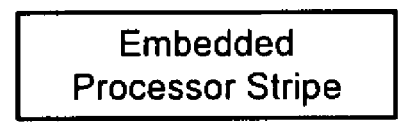
FIG. 9 shows a layout for an embedded processor stripe.
Figure 10:
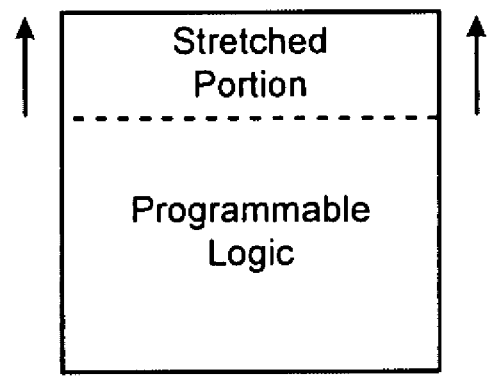
FIG. 10 shows a stretched layout for a programmable logic integrated circuit without an embedded processor portion.
Figure 11:
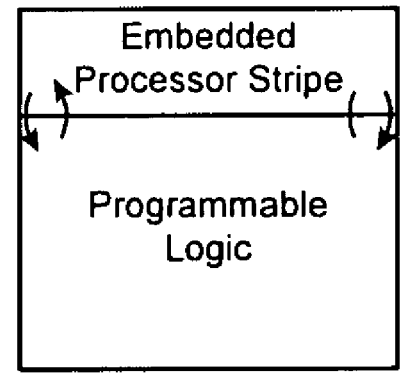
FIG. 11 shows a layout for a programmable logic integrated circuit with an embedded processor portion placed in a stretched section.

FIGS. 8 through 11 illustrate a technique of designing a programmable logic integrated circuit with an embedded processor section, or portion. FIG. 8 shows a layout of a programmable logic integrated circuit, without an embedded processor, that is used as a starting point. Then, as FIG. 10 shows, this layout is stretched using one edge. In the stretched portion, the embedded processor portion is layed out. And, as shown in FIG. 11, signal lines between the embedded processor and programmable logic portions are interconnected. For example, some lines in the programmable logic portion may be disconnected or broken and connected to signal lines in the embedded processor portion, and then a signal line from the embedded processor portion is connected to the broken line. These signal lines allow communication and interaction between the embedded processor and programmable logic portions, and also allow communication and interaction with off-chip devices.

In an alternative embodiment, instead of building the embedded processor section in the stretched area, the embedded processor stripe has been previously layed out as shown in FIG. 9. Then, this stripe is then placed into the stretched section of the programmable logic layout. And, the signal lines are interconnected to allow communication and interaction between the embedded processor and programmable logic portions. This embodiment of the invention may be useful for taking a standard embedded processor strip and using it with a variety of programmable logic integrated circuit products or architectures. Furthermore, the embedded processor stripe may be designed as a circuit block to be incorporated with a programmable logic chip. The embedded processor would be intellectual property that may be licensed or sold to any programmable logic vendor who desires to manufacture a system on a programmable chip with a particular, possibly proprietary, programmable logic architecture, without the need to design the embedded processor section themselves.

Figure 12:
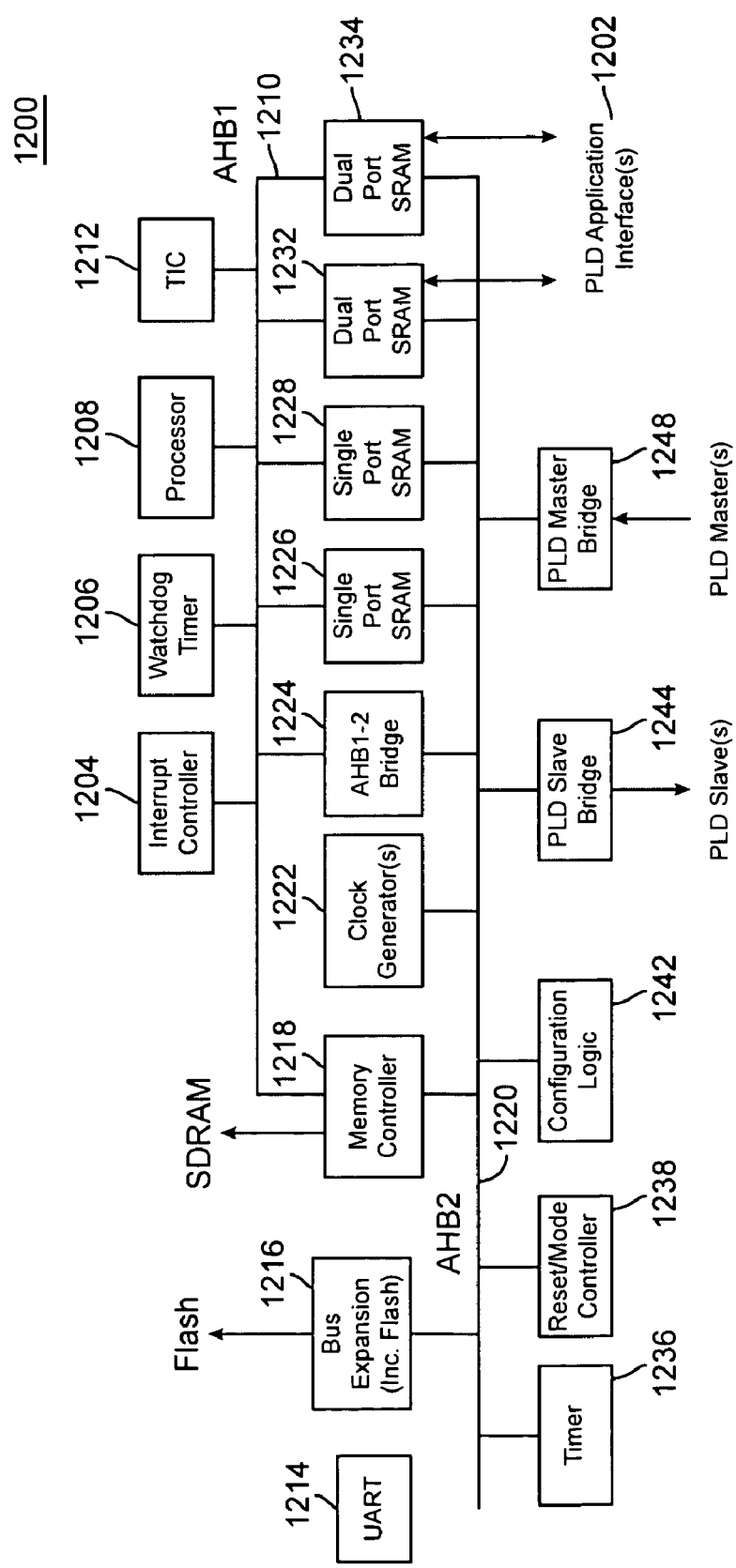
FIG. 12 is a block diagram of a bus architecture for an embedded logic portion of a programmable logic device that includes dual-port SRAMs consistent with embodiments of the present invention.

FIG. 12 is a block diagram of a bus architecture for an embedded logic portion of a programmable logic device that includes dual port memory consistent with embodiments of the present invention. The memories are shown as SRAMs, but, as with all the memories shown in the included figures, they can be other memory types, such as DRAM, Flash, EPROM, EEPROM, or any other memory type. Processor 1208 has a dedicated bus, AHB1 1210, which gives the processor access to interrupt controller 1204, watchdog timer 1206, test interface controller 1212, memory controller 1218, single port SRAMs 1226 and 1228, and dual-port SRAMs 1232 and 1234. An example of a watchdog timer 1206 can be found in commonly-assigned U.S. Pat. No. 7,340,596, filed Jun. 12, 2001, incorporated by reference for all purposes. Processor 1208 may access a second bus, AHB2 1220, through the AHB1-2 bridge 1224. Coupled to the AHB2 bus 1220 are a universal asynchronous receiver and transceiver (UART) 1214, a bus expansion block 1216, timer 1236, reset load controller 1238, configuration logic 1242, PLD Master and slave bridges 1248 and 1244, as well as memory controller 1218, clock generators 1222, the single port SRAMs 1226 and 1228, and dual-port SRAMs 1232 and 1234. The dual-port SRAMs 1232 and 1234 interface to the programmable logic portion 1202, and in an embodiment, to a shared input/output structure. In an embodiment of the present invention, both buses AHB1 1210 and AHB2 1220 are 32 bits wide. Alternately, they may be other widths, and they may be of unequal widths. For example, they may be 16, or 64, or 128 bits wide.

Figure 13A:
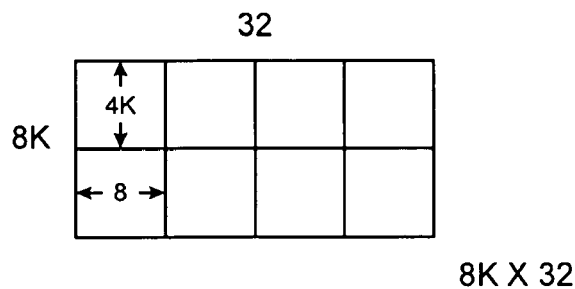
FIGS. 13A, 13B, and 13C, illustrate three memory configurations for a dual-port SRAM.
Figure 13B:
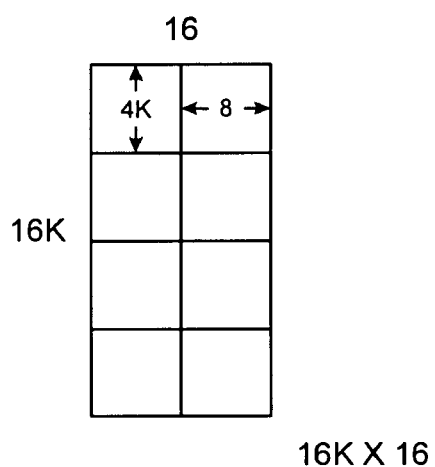
Figure 13C:
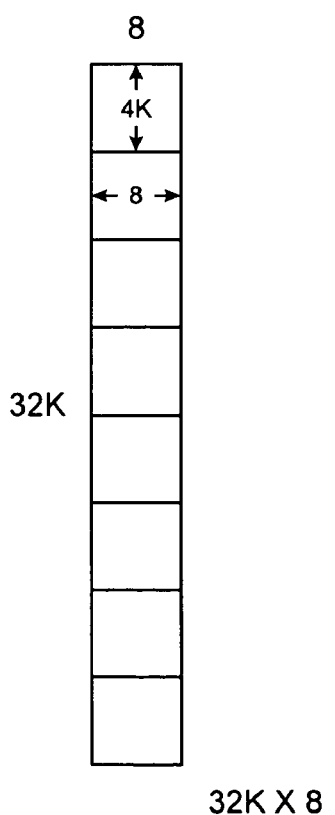

FIGS. 13A, 13B, and 13C, illustrate three memory configurations for a dual-port SRAM consistent with embodiments of the present invention. These examples show a dual-port SRAM having 8 memory blocks, each a size of 4 k by 8 bits. The blocks are arranged in configurations having different widths and depths. In this example, the bus to the memory is 32 bits wide, and the memory map has a width of 32 bits. In FIG. 13A, the individual blocks are arranged in a four wide by two deep configuration resulting in an overall 8 k deep by 32-bit wide memory. Read and write accesses of 32-bit word, 16-bit half word, and 8-bit byte lengths are supported. This configuration occupies 8 k by 32 in a memory map.

One embodiment allows an 8 k by 32 configuration to be split into two memories, each having a port size of 8 k by 16. In this case, one block occupies the lower 8 k by 32, the other occupies the upper 8 k by 32. That is, one block occupies addresses up to 8 k by 32, the other block occupies addresses from 8 k by 32 up to 16 k by 32. In a little endian system, data is in the lower two bytes of each block, the upper two bytes are disregarded for write operations, and return zeros for reads. In this configuration, each block occupies 16 k by 32 in the memory map.

FIG. 13B illustrates an arrangement of 4 k by 8 memory blocks configured in a two wide by four deep pattern resulting in a 16 k by 16-bit memory. Data transfers of word, half word, and byte lengths are supported. In a little endian system, the upper two bytes are disregarded for write operations, and return zeros for reads. This configuration occupies 16 k by 32 in the memory map.

In FIG. 13C, the arrangement is one block wide and eight deep, resulting in a 32 k by 8-bit dual-port SRAM. Data transfers of word, half word, and byte lengths are supported. In a little endian system, the upper three bytes are disregarded during write operations, and return zeros during reads. This configuration occupies 32 k by 32 in the memory map.

In an embodiment of the present invention, the AHB1 1210 and AHB2 1220 buses have arbitrated access to a port of a dual port memory. This port is held at a constant size, in this example 8 k by 32, while a second port connected to the programmable logic portion may vary in the manner shown above. By allowing the programmable logic portion's port to be configurable, the design of the programmable logic portion may be optimized. In another embodiment, both ports can vary as shown above, but vary together such that the dimensions of the two ports are equal. This may be useful in simplifying the design and the processor code. In a further embodiment, both ports can vary, and may be varied independently. In other embodiments, the read and write ports are independently variable, for one or both access ports. Also, the width of the processor bus, and therefore the width that each configuration occupies in the processor memory map may vary. Moreover, the sizes of the building blocks, and the resulting memory dimensions may be different; the above are shown for illustrative purposes only, and as with all the figures shown, do not limit the scope of the invention, or the appended claims.

Figure 14:
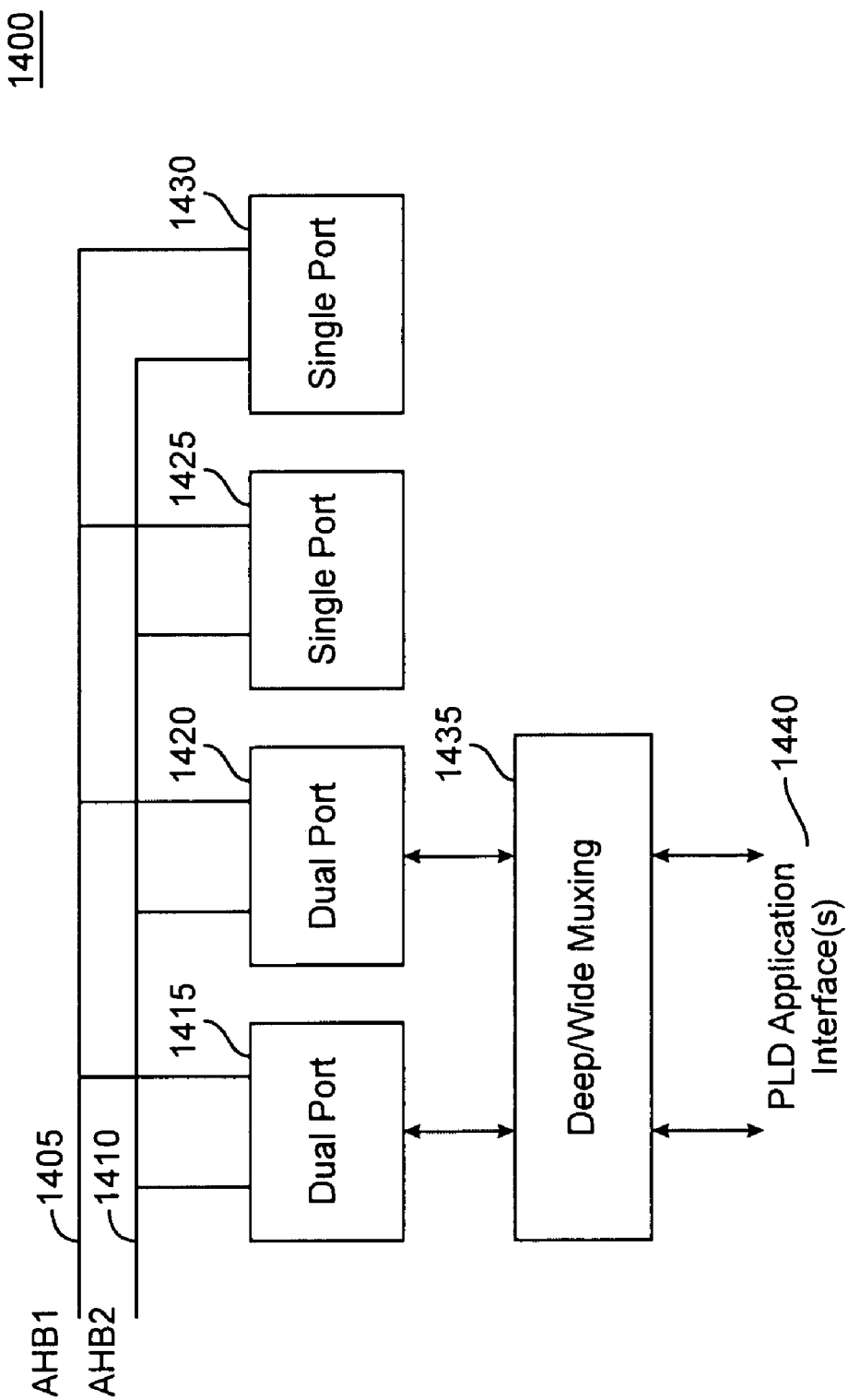
FIG. 14 is a block diagram of a circuit for combining multiple SRAMs into a deeper or wider single SRAM.

In some embodiments of the present invention, two or more dual port memories may be effectively combined into a single dual-port SRAMs that is deeper, wider, or both, than a single dual-port SRAM. FIG. 14 is a block diagram of such a circuit. The processor bus AHB1 1405, and secondary bus AHB2 1410, each couple to a first dual-port SRAM 1415, a second dual-port SRAM 1420, a first single port SRAM 1425, and a second single port SRAM 1430. The dual-port SRAMs coupled to a deep/wide multiplexing block 1435, which in turn couples to the programmable logic portion interfaces 1440. Since in this example there are two dual port memories, they may be effectively spliced together side-by-side or stacked one on top the other. For example, two dual port memories configured as 8 k by 32-bit SRAMs may be combined to form a wider dual-port SRAM that is 8 k by 64 bits. Alternately, the two 8 k by 32 bit SRAMs may be stacked to form a 16 k by 32-bit dual-port SRAM.

As is apparent from this block diagram, the dual port memories 1415 and 1420 can be accessed by the AHB1 bus 1405, the AHB2 bus 1410, as well as the programmable logic portion interfaces 1440. Conflicts may arise if two or more of these interfaces attempt to simultaneously access the same location in memory. For example, if a read operation at one port occurs at the same time and location as a write from the other port, the value read may contain some newly written bits, as well as some previously existing bits. Alternately, hardware attached to one port may need to perform an atomic (that is, performed as one step) read-modify-write cycle. In this case, the other port should be prevented from accessing the same location for the duration of the atomic access. To prevent such conflicts, an embodiment of the present invention includes an arbitration unit along with some or all of the dual-port SRAMs instantiated in the programmable logic device. The arbiter prevents these conflicts by arbitrating access between ports of a dual port memory.

Figure 15:
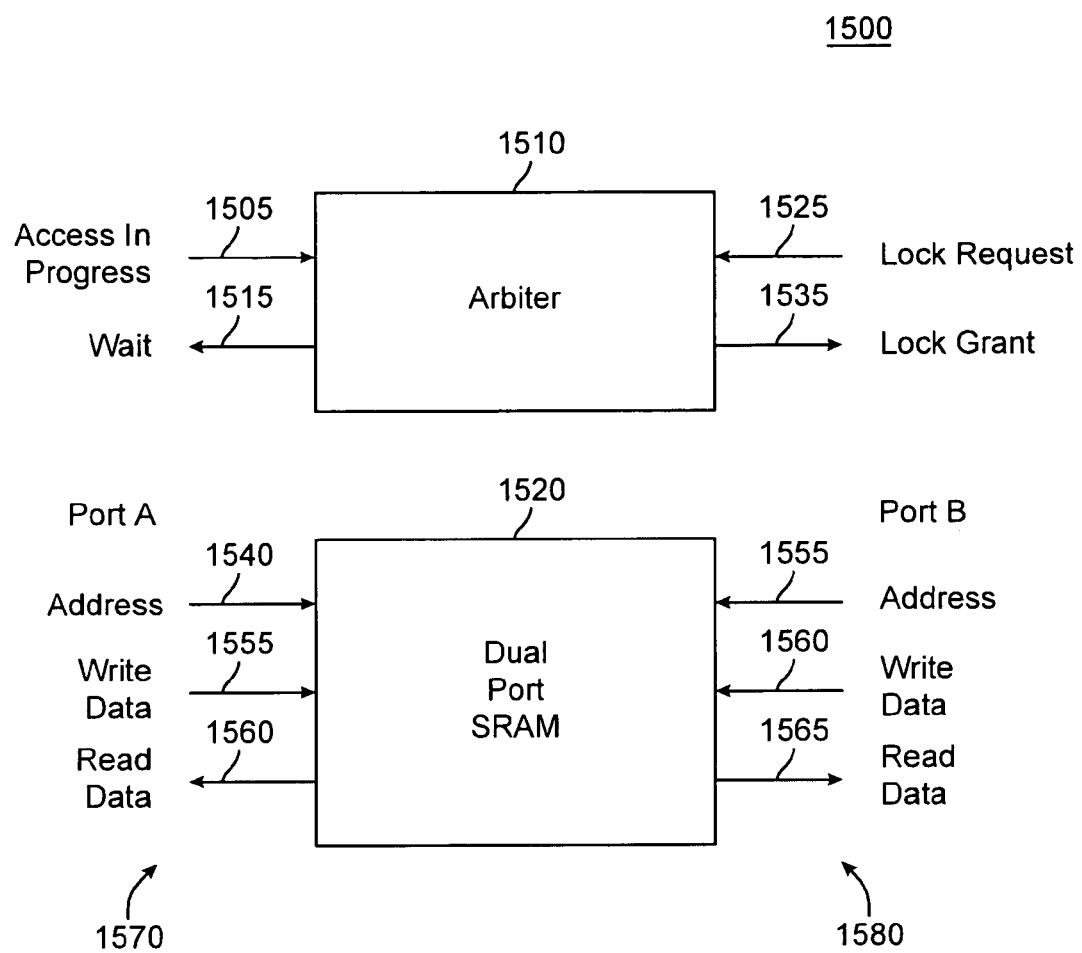
FIG. 15 is a block diagram of an arbitration unit combined with a dual-port SRAM.

FIG. 15 is a block diagram of such an arbitration unit, or arbiter 1510, combined with a memory, specifically a dual-port SRAM 1520. The dual-port SRAM has a Port A 1570 and a Port B 1580. If Port B wishes to perform a locked transfer, that is it wishes to perform a transfer without the chance of a conflict arising, a lock request signal is asserted on line 1525. If Port A is accessing the dual-port SRAM 1520 as indicated by the signal on line 1505, the arbiter 1510 does not grant lock, and Port B does not perform any accesses. When Port A is done accessing the dual-port SRAM 1520, the lock grant signal on line 1535 is asserted by the arbiter. At that time, the Port B data transfers may commence, and the arbiter provides a wait signal on line 1515, which keeps Port A from accessing the dual-port SRAM 1520. When the Port B data transfers are complete, the lock request signal on line 1525 is de-asserted, and the arbiter 1510 de-asserts the wait signal on line 1515. Port A may then access the dual-port SRAM 1520. In an embodiment of the present invention, Port B may ignore the lack of a lock grant, and access the memory, but if it does so, it runs the risk of causing a conflict.

A lock request is sent to an arbiter when a port wishes to avoid the conflicts described above. Also, a lock request is sent when the existing transfer is to be followed by others, and the other port should not interrupt or break the series transfer. In an embodiment of the present invention, the lock grant is maintained even when the interface has completed the transfer, and is maintained until the lock request is de-asserted. That is, a lock grant is not removed until the corresponding request is withdrawn.

Figure 16:
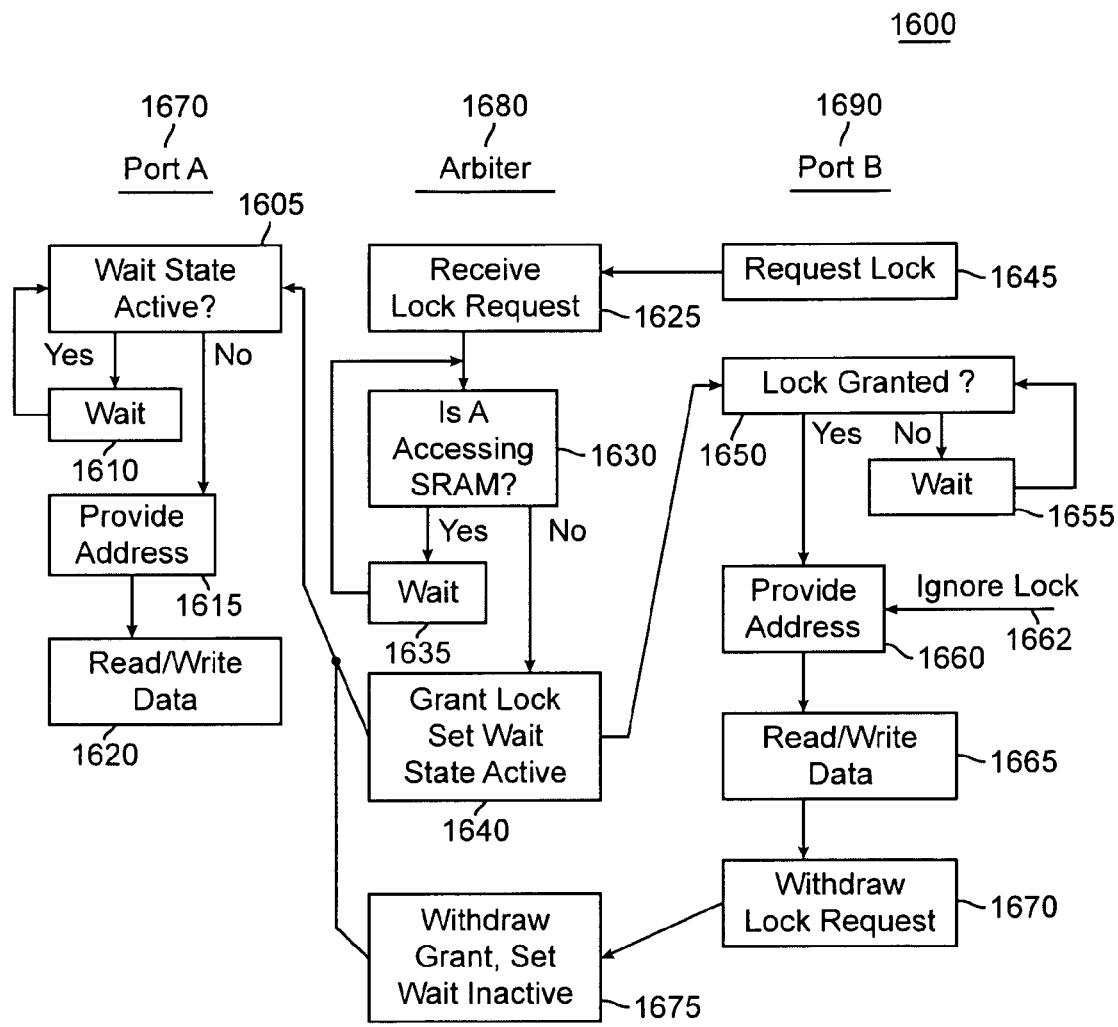
FIG. 16 is a flow chart of a method of arbitrating requests to access a dual-port SRAM.

FIG. 16 is a flow chart 1600 showing a method of arbitrating requests to access a dual port memory consistent with an embodiment of the present invention. The starting point for each of the included flow charts is that the given port or interface requires access to a shared resource, such as a memory. Access is required to complete a data transfer, and transfers may be a write to the memory, a read from the memory, or combinations thereof. When Port A 1670 wishes to access the memory, here a dual-port SRAM, it determines in act 1605 whether the wait state is active. If the wait state is active, Port A waits in act 1610 for the wait state to become inactive. If, or when, the wait state is inactive, Port A may transfer data by providing an address and reading or writing data in act 1615 and 1620. If Port B 1690 wishes to access the SRAM, and a locked transfer is not required, it may provide an address and read or write data. If a locked transfer is needed, a lock request is issued to the arbiter 1680 in act 1640. The arbiter 1680 receives the lock request in act 1625. In act 1630 the arbiter determines if Port A 1670 is accessing the SRAM. If it is, the arbiter waits in act 1635. If it is not, or when Port A is done accessing the SRAM, the arbiter grants lock to Port B, and sets the wait state active on Port A in act 1640. In act 1650, Port B determines whether the lock has been granted. If it has not, it waits in act 1655. Once the lock has been granted, Port B may provide addresses and read or write data to and from the dual-port SRAM in act 1660 and 1665. When this transfer is complete, the lock is withdrawn in act 1670, and the arbiter de-asserts the grant, and withdraws the wait in act 1675.

Figure 17:
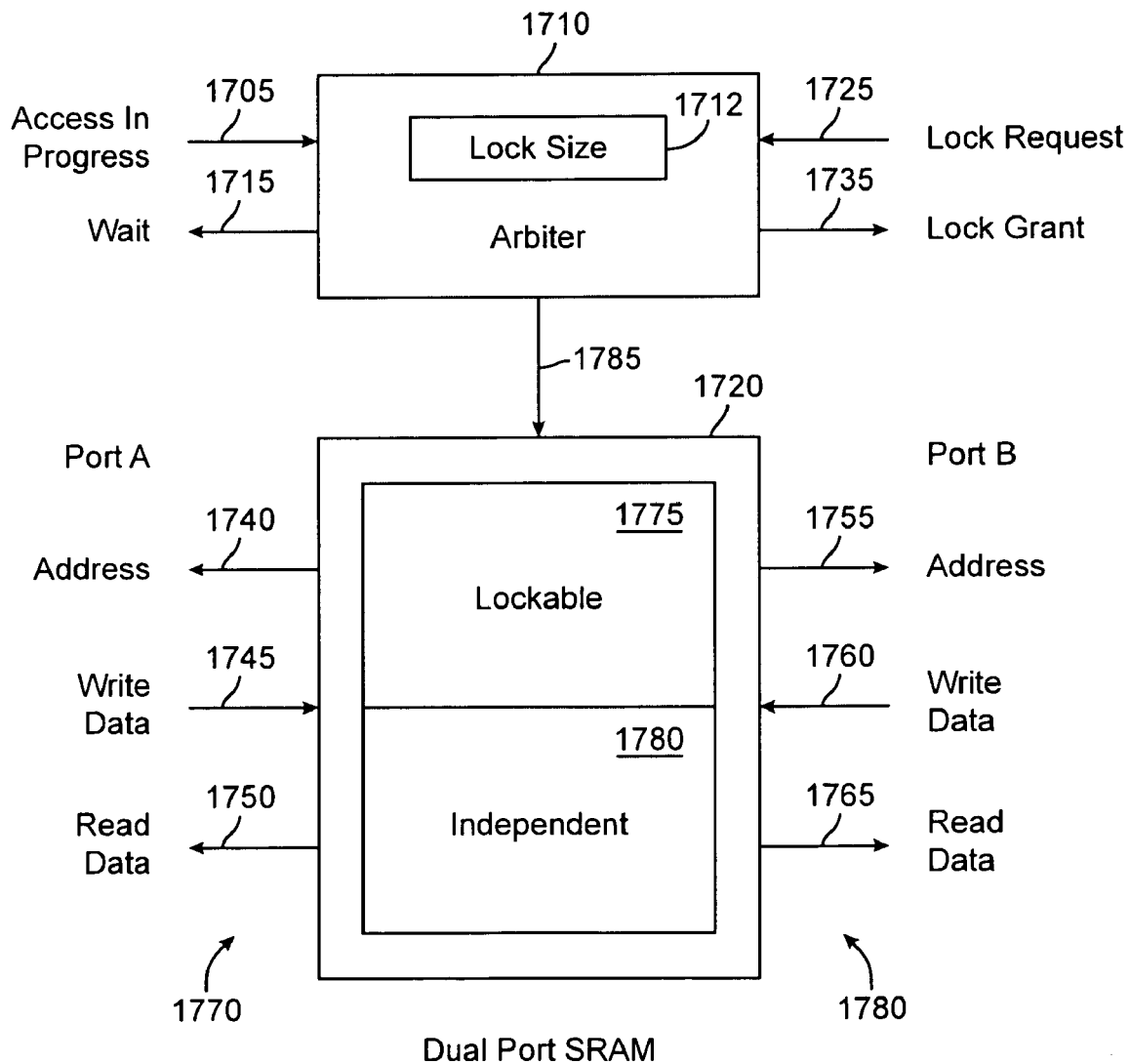
FIG. 17 is a block diagram of an arbiter and dual-port SRAM.

In some architectures, software or hardware external to a dual-port SRAM prevent the simultaneous access by both ports of some or all of the memory locations. In this situation it is an unnecessary burden on Port A to be denied access to those memory locations while Port B is accessing the dual-port SRAM. FIG. 17 is a block diagram of an arbiter 1710 and dual-port SRAM 1720 consistent with an embodiment of the present invention that is capable of reducing this burden. The dual-port SRAM is divided into a lockable portion 1775 and an independent portion 1780. Independent portion 1780 represents that portion of the dual-port SRAM 1720 for which circuitry external to the SRAM prevents access conflicts such as those involving read/write, and read-modify-write atomic transfers. A lockable portion 1770 of the dual-port SRAM 1720 represents that portion of the memory where these conflicts can arise. By not requiring arbitration for the independent portion of the memory, access to those memory cells is speeded up. That is, access times are decreased, since permission to transfer data is not required of the arbiter. The delays caused by the arbiter include processing time which is required for the arbiter to make a decision, and delays in granting access caused by the other port currently having access.

A lock size register 1712 in arbiter 1710 stores a memory location. Alternately, the lock size register 1712 may be separate from the arbiter 1710. The value in the lock size register 1712 is user programmable. That is, size of the lockable portion 1775 of the memory is under programmable control. The user determines how much of the memory is to be allocated to the lockable portion 1775 and independent portion 1780, and writes an appropriate value to the lock register 1712. In one embodiment of the present invention, memory addresses above the value stored in the lock size register 1712 are lockable, and memory locations at or below the value in the lock size register 1712 are independent. It will be obvious to one skilled in the art that these assignments may be reversed, and that the memory location that matches the value in the lock size register 1712 may be defined as being either lockable or independent.

In an embodiment, hardware attached to Port B requests a lock if access to the lockable portion 1775 of the SRAM 1720 is needed. Alternately, the application in the programmable logic portion may be designed such that a lock request is asserted when Port B wants to access any portion of the memory. This alternative simplifies the application since the address does not need to be decoded, but does not take full advantage of the lock register information. Specifically, Port B unnecessarily waits for a lock grant from the arbiter while accessing the independent portion 1780. Also, the application may ignore the lock/grant protocol, though this could result in application errors. The method used is determined by the application in the programmable logic portion.

When a lock has been granted by the arbiter 1710, the arbiter prevents accesses by Port A to the lockable portion 1775, but does not cause Port A to wait for access to the independent portion 1780. If Port B wishes to address a location in the independent portion 1780, it does so without requesting a lock. If Port B wishes to perform a locked transfer to the lockable portion 1775, it requests a lock on line 1725. Again, Port B may ignore the lack of a lock signal. The arbiter 1710 checks whether there is an access in progress by Port A. If Port A is accessing the SRAM, the lock grant on line 1735 is not asserted. Alternately, the arbiter 1710 may determine if Port A is accessing the lockable portion of the memory, and deny a lock grant in that situation. Specifically, the address may be provided to the arbiter which decodes it, and determines whether the address is in the lockable portion of the memory. When the Port A access is complete, the arbiter grants lock on line 1735. At that time, Port B may complete its transfer. When the transfer is complete, the lock request on 1725 is de-asserted, and Port A may access the lockable 1775, as well as the independent portion 1180 of the dual-port SRAM 1720.

Figure 18:
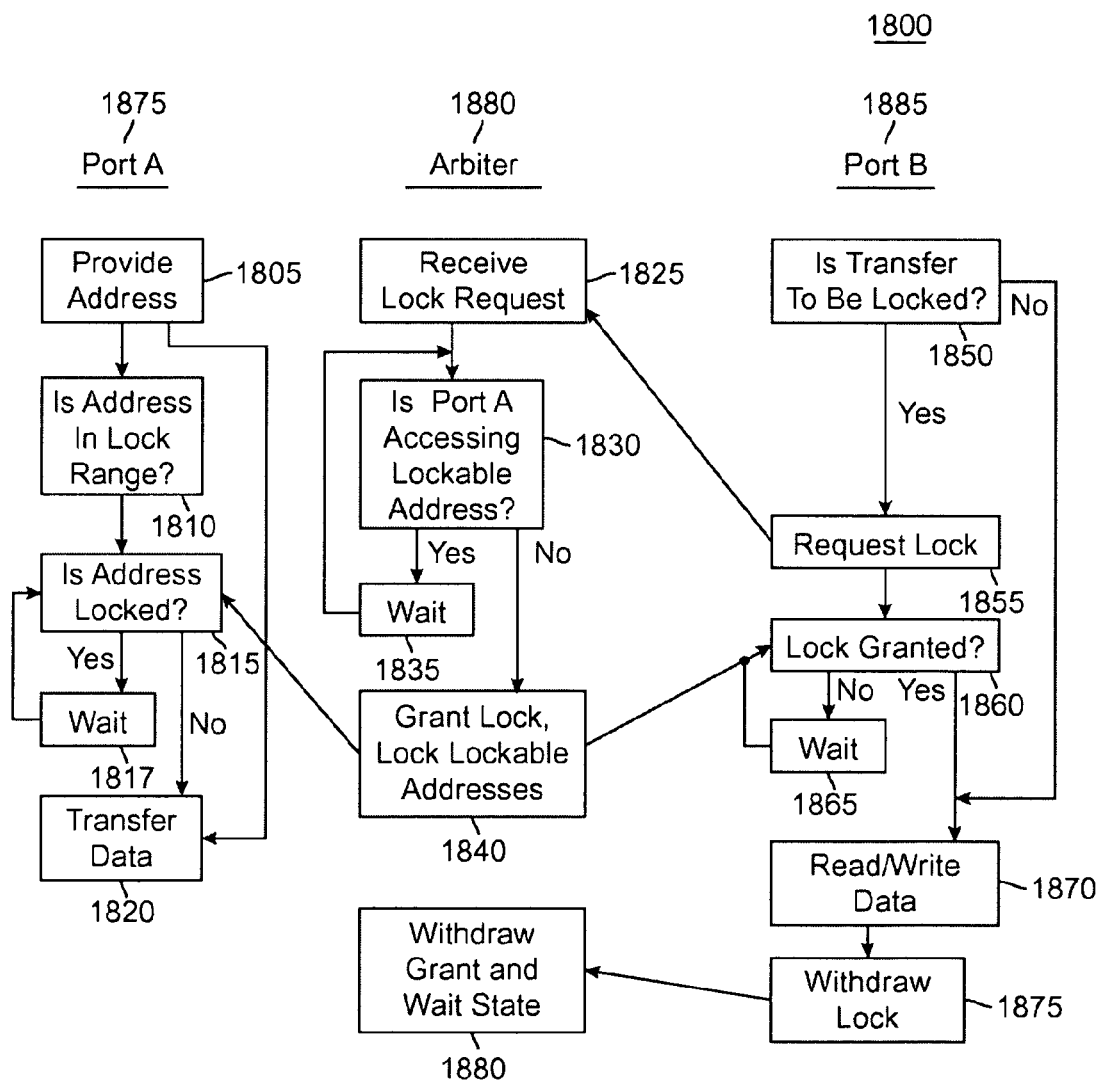
FIG. 18 is a flow chart of a method of arbitrating access requests on the different ports of a dual-port SRAM having a variable lock size.

FIG. 18 is a flow chart 1800 of a method of arbitrating access requests on different ports of a dual-port SRAM having a variable lock size, consistent with an embodiment of the present invention. When Port A 1875 wishes to access the dual port memory, an address is provided in act 1805. This address is decoded, and compared to the contents of a lock register in act 1810. If the address is to an independent portion of the memory, Port A 1875 may access the memory. If the address is to the lockable portion of the memory, it is determined in act 1815 whether this address is presently locked by Port B, for example, by checking the status of a wait state signal. If the address is currently locked, Port A waits in act 1817. If the address is not locked, for example, Port B did not request a lock, or is accessing a non-lockable portion, the transfer may occur in act 1820. When Port B 1885 wishes to access the memory, the application in the programmable logic portion decides whether to request lock. In an embodiment, a lock is requested if the access is to the lockable portion of the memory. Alternately, if the application does not decode the address, a lock may be requested for all accesses to the memory. Also, as above, the application may ignore the grant signals, and proceed with an access without a prior lock request.

When Port B requires access to the memory, it is determined in act 1850 whether the transfer is to be locked. If the transfer is not to be locked, Port B may complete the transfer in acts 1870 and 1875. If Port B wishes to perform a locked transfer, a lock is requested in act 1855 from the arbiter 1880. In act 1825, the arbiter receives the lock request from Port B. In act 1830 it is determined whether Port A is accessing a lockable address. Alternately, in this act, the arbiter may simply determine whether Port A is addressing the SRAM. If the answer is yes, the arbiter waits in act 1835 until the Port A transfer is complete. At that time the lock is granted to Port B and Port A is locked out of the lockable addresses. Alternately Port A may be locked out of the SRAM entirely. In act 1860, it is determined by Port B whether the lock has been granted. If not, Port B waits in act 1865 for the lock to be granted. When lock is granted, the data transfer may take place in act 1870. When the transfer is completed, the lock request is withdrawn, and Port A may freely access the SRAM.

Figure 19:
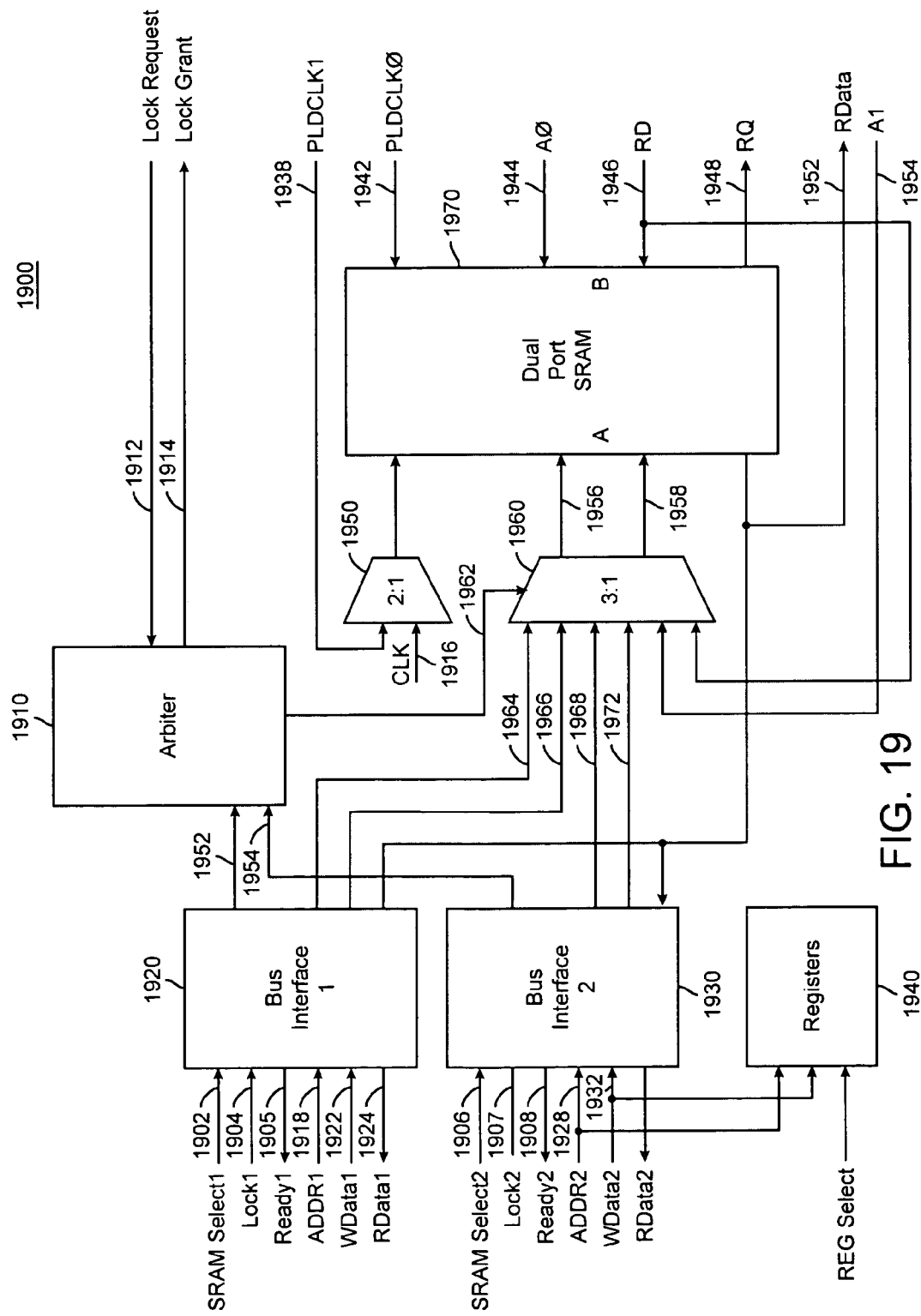
FIG. 19 is a block diagram of a dual-port SRAM, arbiter, and surrounding circuitry.

FIG. 19 is a block diagram including a dual-port SRAM 1970 and arbiter 1910 consistent with an embodiment of the present invention. Also included are a first bus interface 1920, a second bus interface 1930, data registers 1940, and multiplexers 1950 and 1960. Addresses are provided to bus interface 1 1920 on bus 1918. Data to be written to the SRAM is provided on bus 1922, and data read from the memory is provided on bus 1924. A second address is provided to bus interface 2 1930 on bus 1928. Write data is provided on bus 1932, and read data from the SRAM is received on bus 1934. Address bus 1928 is also used to select individual data registers in data registers block 1940. Data to be written to the data registers is provided on bus 1932. Addresses and data from bus interface 1 1920 and bus interface 2 1930 are multiplexed by multiplexer 1960. In an embodiment of the present invention, addresses provided by the programmable logic portion on bus 1954, as well as data on bus 1946, are also multiplexed to buses 1956 and 1958 of Port A under control of the arbiter 1910. By including this third multiplexer input, the SRAM may be configured such that the programmable logic portion accesses both Port A and Port B. SRAM select, lock, and ready signals are provided to the bus interface 1 1920 on lines 1902, 1904, and 1905. Bus interface 1 1920 decodes these signals, and provides outputs on bus 1952 to the arbiter 1910. Similarly, SRAM select, lock, and ready signals are provided to the bus interface 2 1930 on lines 1906, 1907, and 1908, and decoded output signals are provided to the arbiter on bus 1954.

Port B receives addresses from the programmable logic portion on bus 1944, write data on bus 1946, and outputs read data on bus 1948. A clock is provided to Port B on line 1942. Multiplexer 1950 selects a clock either from the embedded logic portion on line 1916, or from the programmable logic portion on line 1938. Arbiter 1910 controls access to Port A by bus interface 1 1920, bus interface 2 1930, and the programmable logic portion. Arbiter 1910 also prevents conflicts of the type described above between Port A and Port B.

Circuitry coupled to bus interface 1 1920 can request accesses to the SRAM by asserting an SRAM select signal on line 1902. If there is no conflict, the arbiter sends a ready signal on line 1905, and the transfer from bus interface 1 1920 may proceed. If a locked transfer is required by bus interface 1, a lock signal is sent to the arbiter on line 1904. If there is no conflict, a ready signal is sent on line 1905 and the locked transfer may proceed. Similarly, bus interface 2 may request access to the SRAM by asserting an SRAM select signal on line 1906, or request a lock using line 1907, and the arbiter informs bus interface 2 that it may proceed by asserting a ready signal on line 1908. Similarly, if the programmable logic portion wishes to perform a locked transfer, a lock request signal is applied to the arbiter on line 1912. If there is no conflict, a lock grant signal is sent to the programmable logic portion on line 1914. If bus interface 1 wishes to either access or lock access to the memory, the arbiter 1910 determines if bus interface 2 has already locked the SRAM, or if the programmable logic portion has already been granted a lock to the memory cell which bus interface 1 is accessing. Similarly, if the programmable logic portion requests a lock from the arbiter 1910, the arbiter 1910 determines whether either the first bus interface 1920 or second bus interface 1930 is currently accessing the lockable portion of the dual-port SRAM 1970, and does not granted lock until such access is complete. Alternately, in other embodiments, the arbiter determines whether bus interface 1 1920 or bus interface 2 1930 is accessing any portion of the dual-port SRAM 1970, and does not granted a lock until such access is complete.

Figure 20:
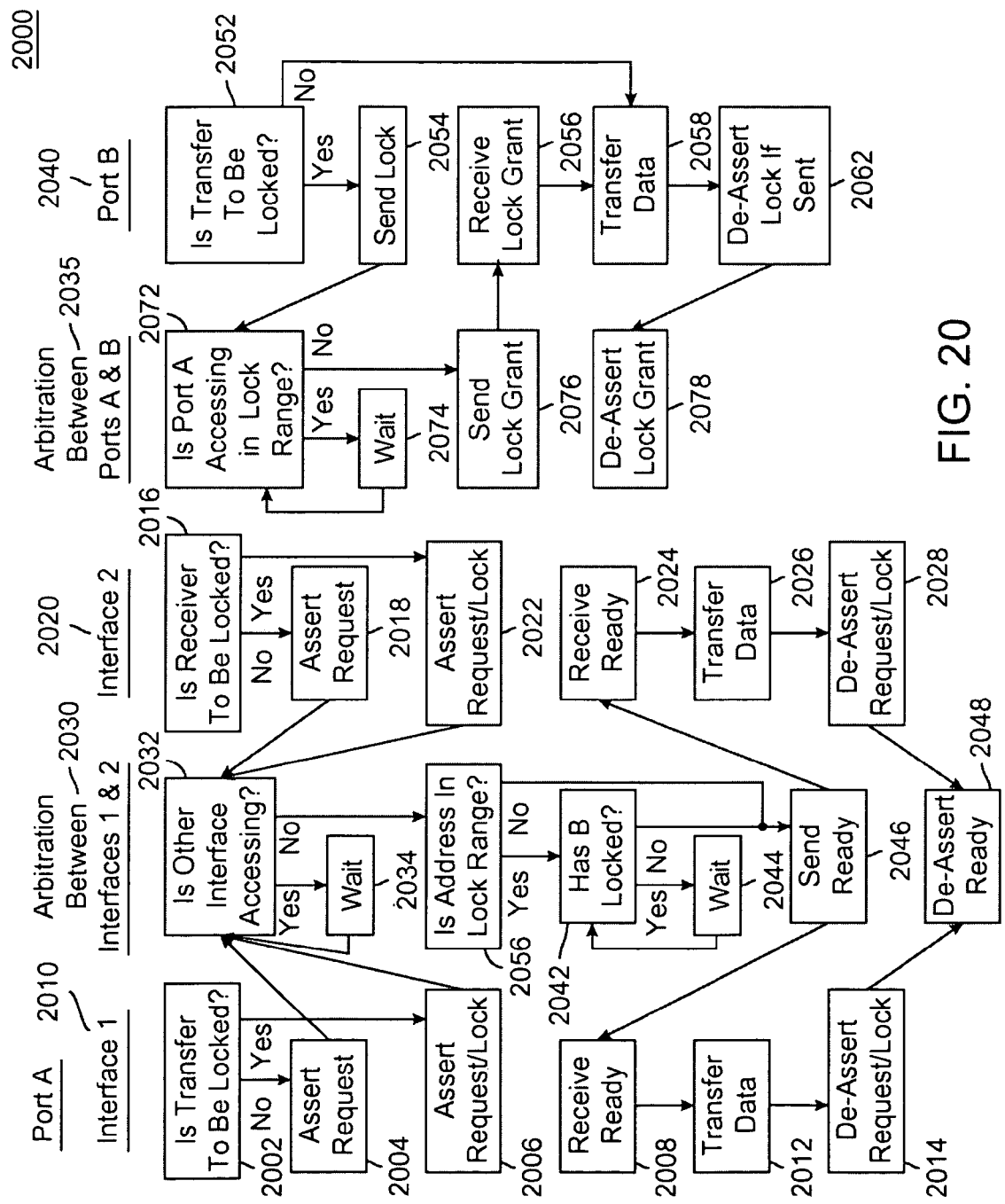
FIG. 20 is a flow chart of a method of arbitrating requests for access to a dual-port SRAM by a first interface, a second interface, and a programmable logic portion interface.

FIG. 20 is a flow chart 2000 of a method of arbitrating requests for access to a dual-port SRAM by a first interface 2010, a second interface 2020, and a programmable logic portion interface 2040. The arbitration between the first and second interfaces are shown as 2030, while the arbitration between the two ports is 2035. When interface 1 wishes to complete a transfer, it is determined in act 2002 whether the first interface wishes the transfer to be locked. If not, a request for access is sent in act 2004 to the arbiter 2030. If a locked transfer is required, a request for access and a lock request is sent in act 2006. In act 2032, the arbiter determines whether the other interface is accessing the SRAM. If it has, the arbiter waits in act 2034 until the SRAM is released by the other interface. If the other interface is not accessing the SRAM, it is determined in act 2036 whether the location is lockable. This is done by comparing the address presented to the interface with the value in a lock register. If the address is not lockable, a ready signal is sent in act 2046. If it is lockable, the arbiter determines in act 2042 whether Port B has been granted lock. If it has, the arbiter waits in act 2044. If it has not, a ready signal is received by interface 1 in act 2008. At that time, the data may be transferred in act 2012, after which the lock or request signal is de-asserted in act 2014. Once the lock or request has been de-asserted, the ready signal is de-asserted by the arbiter in act 2048.

Similarly, if interface 2 2020 wishes to complete a transfer, it is determined in act 2016 whether a locked transfer is required. If it is not, an access request is sent to the arbiter in act 2018. If a locked transfer is required, an access request and a lock request is sent in act 2022. In act 2032 the arbiter 2030 determines whether interface 1 is accessing the SRAM. If it has, the arbiter again waits in act 2034. If it has not, the arbiter determines whether the is in the lock range defined by the lock register. If the address is not lockable, a ready signal is sent to interface 2 in act 2046. If the address is lockable, the arbiter determines in act 2042 whether Port B has been granted lock. If it has, the arbiter waits in act 2044. If it has not, then a ready signal is sent to interface 2, and received in act 2024. Once the ready signal has been received, the data transfer may take place in act 2026. When the data transfer is complete, the lock or request signal is de-asserted in act 2028, whereupon the arbiter de-asserts the ready signal in act 2048.

If the programmable logic portion interface connected to Port B 2040 wishes to transfer data, it is determined in act 2052 whether the transfer is to be locked. If it is not, the transfer may be completed. If the transfer is to be locked, a lock is signal is sent in act 2054. In act 2072, the arbiter 2035 determines whether Port A is accessing a location in the lock range. Alternately, it may be determined whether Port A is accessing the memory. If it is, the arbiter waits in act 2034. If it is not, the arbiter provides a lock grant to Port B in act 2076. The lock grant is received in act 2056. At that time, the data may be transferred in 2058. Once the transfer of data is complete, lock is de-asserted in act 2062, whereupon the arbiter de-asserts the grant in act 2048.

If more than one of the interfaces connected to the memory want access, the arbiter may grant such access in a round robin algorithm. Alternately, a round robin with fairness method may be used, or any other algorithm may be used.

Again, a lock request is sent from one of the interfaces to the arbiter in order to avoid the conflicts described above. Also, a lock request is sent when the existing transfer is to be followed by others, and the other port should not interrupt or break the series transfer. In an embodiment of the present invention, the lock grant is maintained even when the interface has completed the transfer, and is maintained until the lock request is de-asserted. That is, a lock grant is not removed until the corresponding request is withdrawn.

Figure 21:
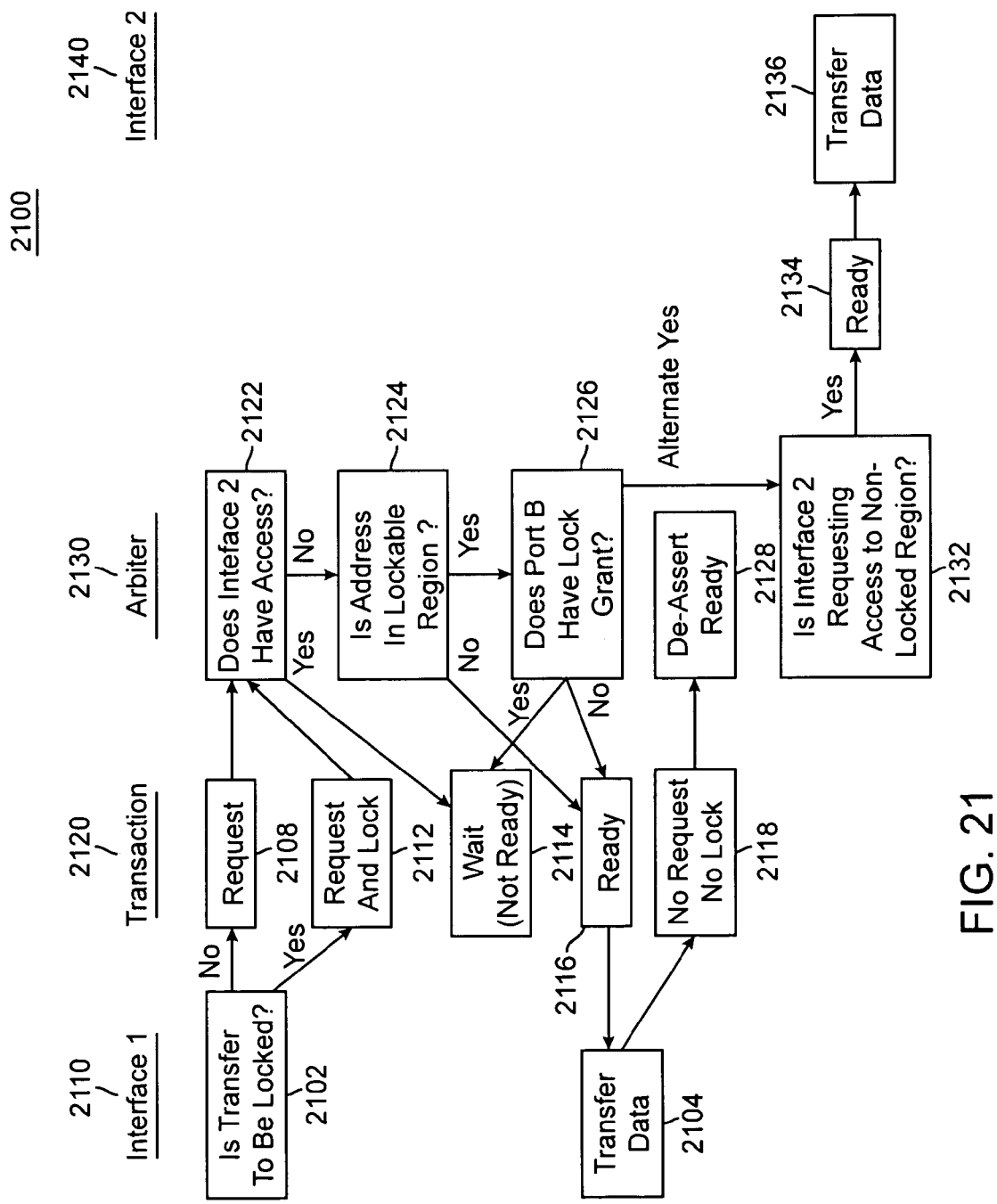
FIG. 21 is a flowchart showing transactions between a first bus interface and an arbiter.

FIG. 21 is a flowchart 2100 showing transactions 2120 between a first bus interface, interface 1 2110, and an arbiter 2130. This flowchart presumes that interface 12110 wishes to access a shared resources such as a dual-port SRAM. Port A is shared between the first bus interface and a second bus interface 2140. In act 2102 it is determined whether the transfer is to be locked. If it is not, a request for access is sent in act 2108. If the transfer is to be locked, a request for access and a request for lock is sent in act 2112. In act 2122, the arbiter 2130 determines whether interface 2 has access to the shared Port A. If it does, the arbiter instructs interface 1 to wait in act 2114. If not, the arbiter determines in act 2124 whether the address is in a lockable region of memory. If it is not, the arbiter sends a ready signal 2116 to interface 1, which may then transfer data in act 2104. If the address is a lockable region, it is determined whether Port B has been granted lock in act 2126. If not, a ready signal is sent, and if it has, interface 1 waits in act 2114. Alternately, if Port B has been granted lock, it may be determined in act 2132 whether interface 2 is requesting access to a non-locked region. If it is, the arbiter 2130 may grant a ready 2134 to interface 2 2140. Interface 2 2140 may then transfer data in act 2136. Once data has been transferred in act 2104, the request signal, and lock signal if asserted, are de-asserted in act 2118, and in act 2128 the arbiter de-asserts the ready signal.

Figure 22:
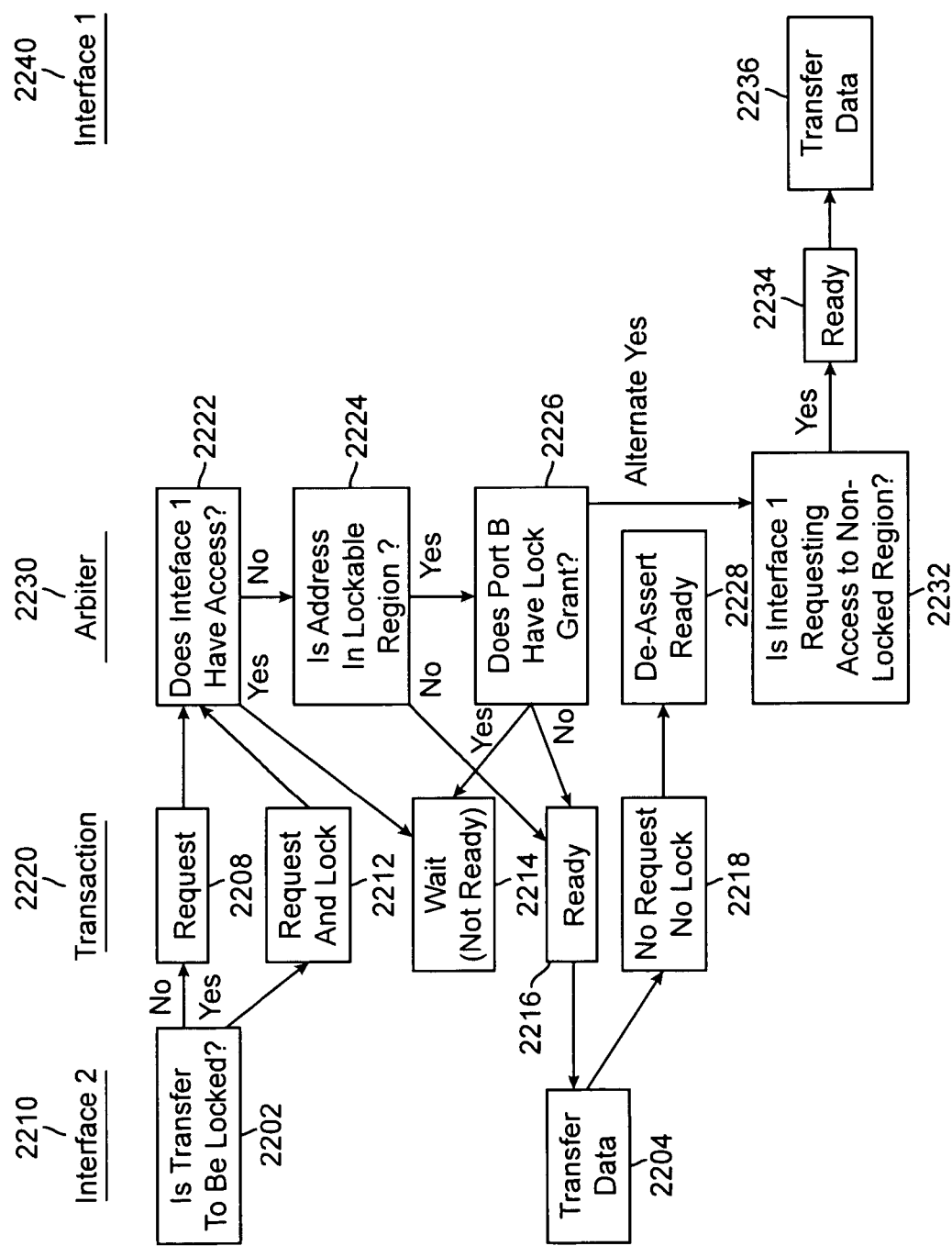
FIG. 22 is a flowchart showing transactions between a second bus interface and an arbiter.

Similarly, FIG. 22 is a flowchart 2200 showing transactions 2220 between a second bus interface, interface 2 2210, and an arbiter 2230. This flowchart presumes that interface 2 2210 wishes to access a shared resources such as a dual-port SRAM. Port A is shared between the first bus interface and a first bus interface 2240. In act 2202 it is determined whether the transfer is to be locked. If it is not, a request for access is sent in act 2208. If the transfer is to be locked, a request for access and a request for lock is sent in act 2212. In act 2222, the arbiter 2230 determines whether interface 1 has access to the shared Port A. If it does, the arbiter instructs interface 2 to wait in act 2214. If not, the arbiter determines in act 2224 whether the address is in a lockable region of memory. If it is not, the arbiter sends a ready signal 2216 to interface 2, which may then transfer data in act 2204. If the address is a lockable region, it is determined whether Port B has been granted lock in act 2226. If not, a ready signal is sent, and if it has, interface 2 waits in act 2214. Alternately, if Port B has been granted lock, it may be determined in act 2232 whether interface 1 is requesting access to a non-locked region. If it is, the arbiter 2230 may grant a ready 2234 to interface 1 2240. Interface 1 2240 may then transfer data in act 2236. Once data has been transferred in act 2204, the request signal, and lock signal if asserted, are de-asserted in act 2218, and in act 2228 the arbiter de-asserts the ready signal.

Figure 23:
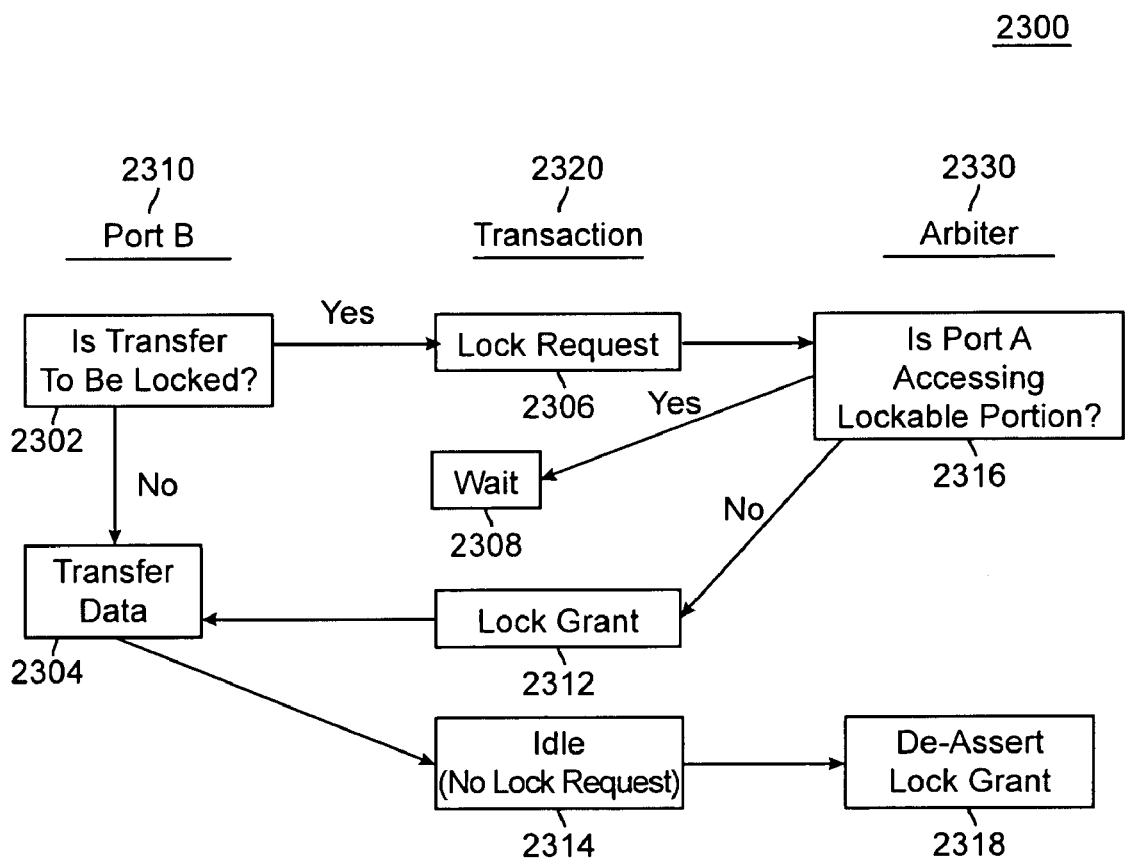
FIG. 23 is a flowchart showing transactions between Port B and an arbiter.

FIG. 23 is a flowchart 2300 showing transactions 2320 between Port B 2310 and arbiter 2330. When Port B requires access to the memory, it is determined in act 2302 whether the transfer is to be locked. If not, the transfer may go ahead in act 2304. If the transfer is to be locked, a lock request is sent in act 2306. The arbiter 2330 determines in act 2316 whether Port A is accessing a lockable portion of the memory. If it is, the arbiter waits in act 2308. If not, a lock grant 2312 is sent to Port B. Upon receipt of the locked grant, the data may be transferred in act 2304. Once the transfer is complete, Port B returns to idle and de-asserts the lock request in act 2314. At this point, the locked grant is de-asserted by the arbiter in act 2318.

Figure 24:
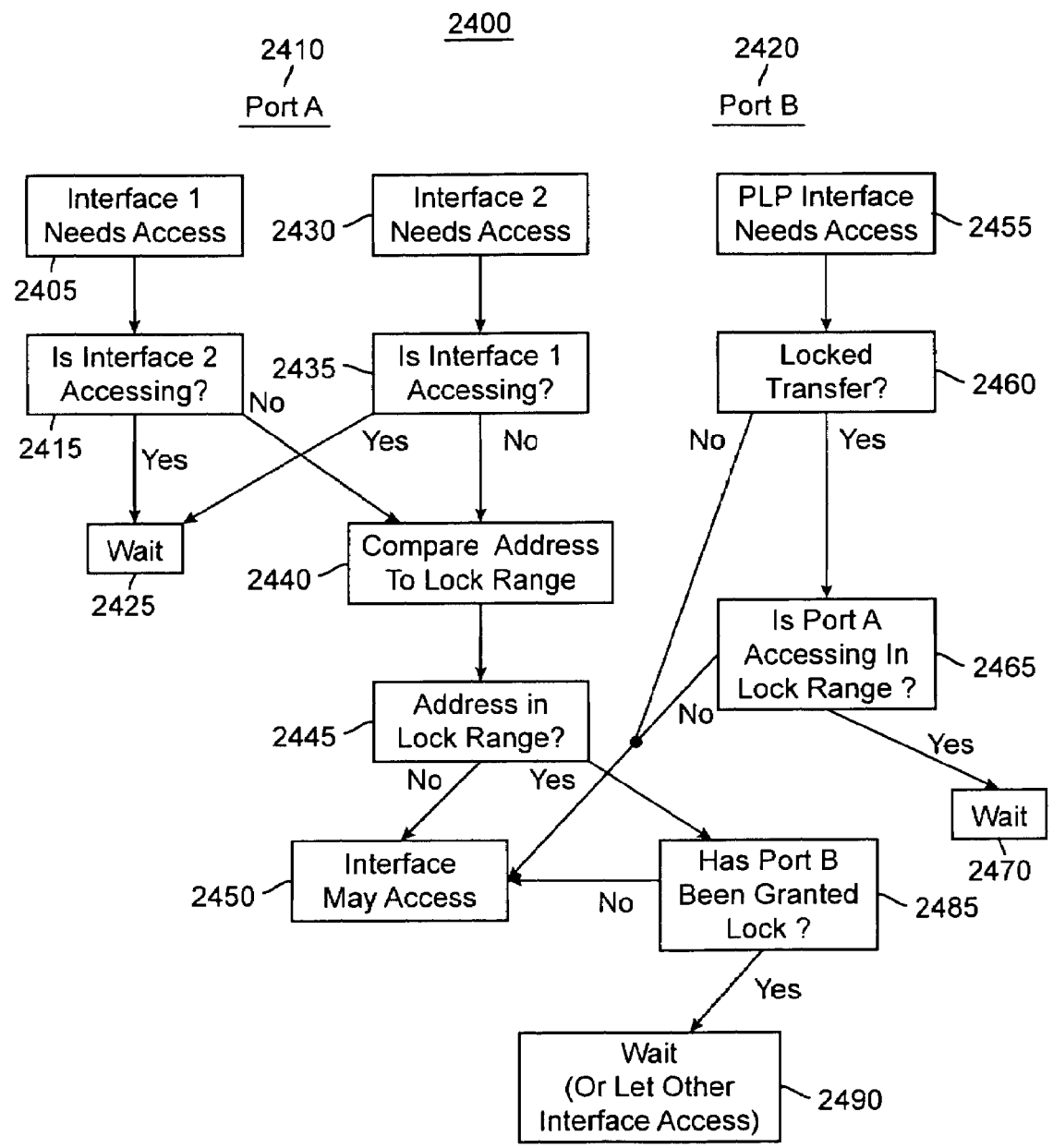
FIG. 24 is a flowchart showing a method of arbitration for access between a first interface and a second interface coupled to Port A, and Port B, of a shared resource.

FIG. 24 is a flowchart 2400 showing a method of arbitration for access between a first interface and a second interface coupled to Port A 2410, and Port B 2420, of a shared resource such as a dual-port SRAM. When interface 1 requires access to the memory, interface 1 requests access to the resource in act 2405. In act 2415, it is determined whether interface 2 currently has access. If it is, then interface 1 waits in act 2425. If not, the address of the memory location to be accessed is compared to the value stored in a lock register in act 2440. It is determined in act 2445 whether the address is in the lock range. If not, then the interface may access the resource in act 2450. If the address is in the lock range, in act 2485 it is determined whether Port B has been granted lock. If it has, in act 2490 the interface waits. Alternately, the other interface may access the shared resource, if it is accessing a memory location outside of the lock range. If Port B has not been granted lock, then the interface may access the resource in act 2450. Similarly, when interface 2 requires access in act 2430, it is determined whether interface one has access in act 2435 and the process continues as above.

When Port B needs access in act 2455, it is determined whether the transfer is to be locked in act 2460. In some embodiments, only transfers to the locked region are locked. Alternately, if Port B does not wish to decode the address, it may request a lock for all transfers. If the transfer is not to be locked, Port B may access the shared resource in act 2450. If the transfer is to be locked, it is determined in act 2465 whether Port A is accessing a location in the lock range. If the answer is yes, Port B waits in act 2470. If not, Port B may access the resource in act 2450.

Figure 25:
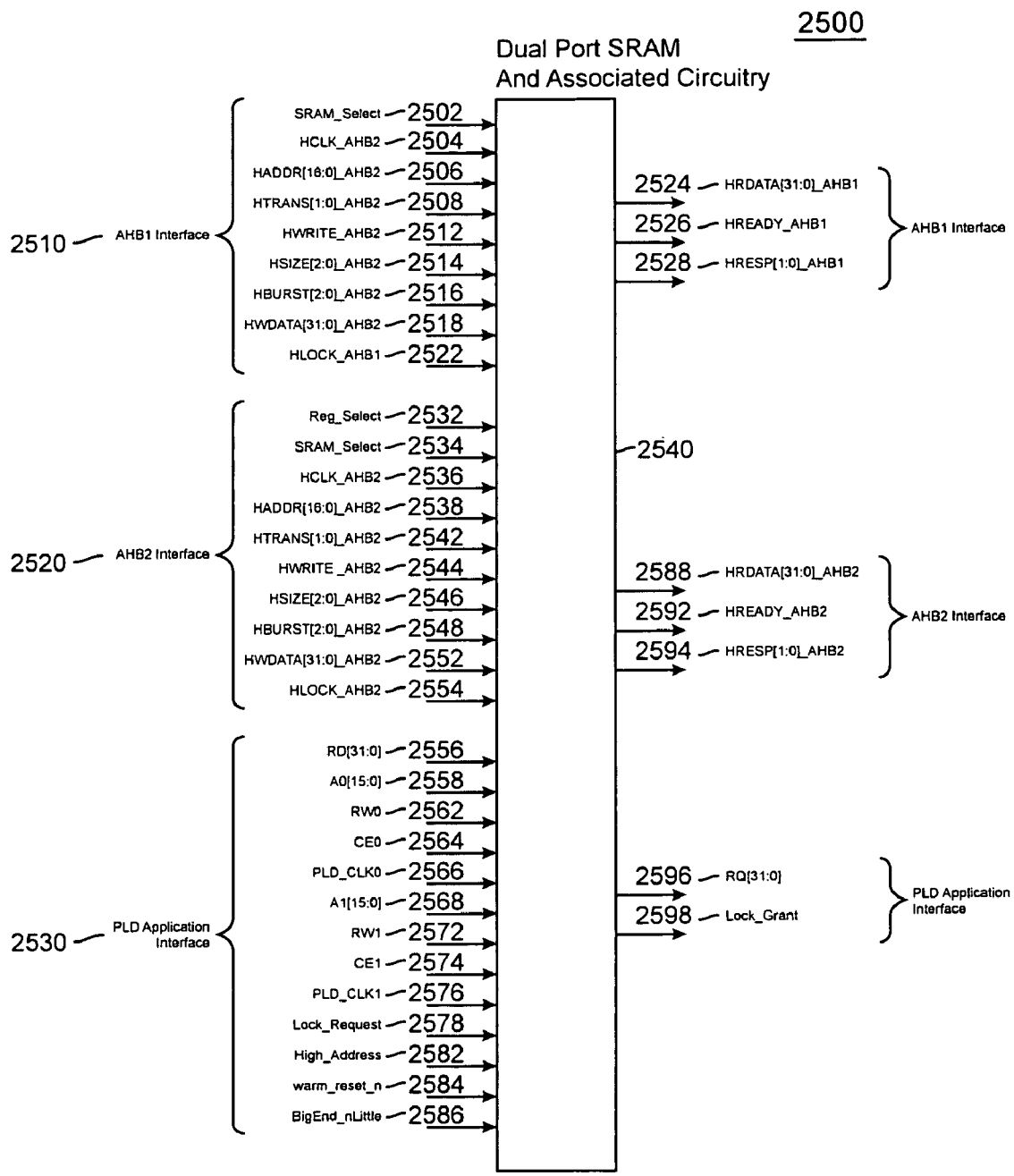
FIG. 25 is a diagram showing input and output signals for a dual-port SRAM and associated circuitry.

FIG. 25 is a diagram of the input and output signals for a dual-port SRAM and associated circuitry consistent with an embodiment of the present invention. Included are signals to and from AHB1 interface 2510, AHB2 interface 2520, and programmable logic portion interface 2530. The AHB1 interface 2510 requests access to the dual-port SRAM by asserting a SRAM select signal on line 2502. A clock signal is applied on line 2504. Memory addresses are provided on bus 2506. The two HTRANS bits on bus 2508 provide four states, which allow the bus master to indicate whether a transfer is the start of a burst, the middle of a burst, or whether the bus is in the idle state. HTRANS also allows bus masters to insert wait states within bursts. A write enable signal is applied on line 2512, and the transfer size is determined by the value of HSIZE[2:0] on bus 2514. Write data is provided to the memory on bus 2518, and lock requests are made using line 2522. Data is read out of the memory to the AHB1 interface on bus 2524. The arbiter informs the interface that a transfer may occur by sending a ready signal on line 2526, and whether there was an error is indicated by the HRESP bits on bus 2528. Similarly named signals provide the same function for AHB2 interface 2520. Additionally, a register select signal is provided on line 2530 when transfers to one of the data registers is desired.

Write data is provided to the memory from the programmable logic portion on bus 2556. A first address is provided on bus 2558, and a second addresses provided on 2568. The first address is used by Port B of the dual-port SRAM, and the second addresses is multiplexed with addresses from the AHB1 interface 2510 and the AHB2 interface 2520. A read/write control signal is applied on line 2562, and a clock enable signal is applied on line 2564. A first clock, which is provided to Port B, is applied to line 2566. A second clock on line 2576 is multiplexed to Port A. Lock request signals are sent using line 2578, and grant signals are received on line 2598. Data read back from the memory is provided on bus 2596. A reset signal is provided on line 2584. A high address signal is provided on line 2582 to all the dual-port SRAM's involved in a deep/wide multiplexing schemes, and provides the extra address bit required by the larger memory configuration. Big and little endian configurations are supported, and determined by the state of the BigEnd_nLittle signal on line 2586.

Embodiments of the present invention have been explained with reference to particular examples and figures. Other embodiments will be apparent to those of ordinary skill in the art. Therefore, it is not intended that this invention be limited except as indicated by the claims.

What is claimed is:

1. A programmable logic integrated circuit comprising:
    a programmable logic portion comprising a plurality of logic elements, programmably configurable to implement user-defined combinatorial or registered logic functions; and
    an embedded processor portion coupled to the programmable logic portion and comprising:
        a plurality of memory cells;
        a first port coupled to the plurality of memory cells;
        a second port coupled to the plurality of memory cells;
        a multiplexer coupled to the first port;
        an arbiter coupled to the first port, the second port, and the multiplexer; and
        a lock register to store a user-defined variable lock size and coupled to the arbiter,
    wherein the user-defined variable lock size defines a lockable portion of the plurality of memory cells and a non-lockable portion of the plurality of memory cells, and
    wherein the arbiter arbitrates access by the second port to the lockable portion of the plurality of memory cells, and does not arbitrate access by the second port to the non-lockable portion of the plurality of memory cells.

2. The integrated circuit of claim 1 wherein the embedded processor portion further comprises:
    a first bus coupled to the multiplexer;
    a second bus coupled to the multiplexer; and
    a processor coupled to the first bus.

3. The integrated circuit of claim 1 wherein when the second port requires access to the lockable portion of the memory, the second port sends a lock request to the arbiter, the arbiter determines whether the first port is accessing the lockable portion of the memory, the arbiter sends a lock grant signal to the second port if the first port is not accessing the lockable portion of the memory, and the arbiter does not send the lock grant signal if the first port is accessing the lockable portion of the memory, and wherein when the second port requires access to the non-lockable portion of the memory, it accesses the non-lockable portion of the memory without sending the lock request to the arbiter.

4. The integrated circuit of claim 2 wherein when the first bus requires access to the memory, the first bus sends a request to the arbiter, the arbiter determines whether the second bus has access to the memory, the arbiter determines whether the first bus requires access to the lockable portion of the memory if the second bus does not have access to the memory, and the arbiter determines if the second port has been granted a lock to the lockable portion of the memory if the first bus requires access to the lockable portion of the memory.

5. A programmable logic integrated circuit comprising:
    a programmable logic portion; and
    an embedded processor portion coupled to the programmable logic portion and comprising:
        a first number of lockable memory cells;
        a second number of non-lockable memory cells;
        a first port coupled to the lockable and non-lockable memory cells;
        a second port coupled to the lockable and non-lockable memory cells and the programmable logic portion;
        an arbiter coupled to the first port and the second port; and a variable lock size register coupled to the arbiter, wherein the register stores a user-programmable lock size value,
wherein the first number plus the second number equal a third number, and the first number and second number are variable and determined by the user-programmable lock size value, the third number is not variable, and wherein the arbiter arbitrates access to the lockable memory cells by the second port, and does not arbitrate access to the non-lockable memory cells by the second port.

6. The integrated circuit of claim 5 wherein the embedded processor portion further comprises:
a multiplexer coupled to the arbiter and the first port;
a first bus coupled to the multiplexer;
a second bus coupled to the multiplexer; and
a processor coupled to the first bus.

7. The integrated circuit of claim 6 wherein when the first bus requires access to the memory, the first bus sends a request to the arbiter, the arbiter determines whether the second bus has access to the memory, the arbiter determines whether the first bus requires access to the lockable portion of the memory if the second bus does not have access to the memory, and the arbiter determines if the second port has been granted a lock to the lockable portion of the memory if the first bus requires access to the lockable portion of the memory.

8. The integrated circuit of claim 5 wherein the programmable logic portion comprises a plurality of logic elements programmably configurable to implement user-defined combinatorial or registered logic functions.

9. An integrated circuit including a memory comprising:
a plurality of memory cells;
a first port coupled to the plurality of memory cells;
a second port coupled to the plurality of memory cells;
an arbiter coupled to the first port and the second port; and
a register to store a user-defined variable lock size and coupled to the arbiter,
wherein the user-defined variable lock size defines a lockable portion of the plurality of memory cells and a non-lockable portion of the plurality of memory cells, and wherein the arbiter arbitrates access by the second port to the lockable portion of the plurality of memory cells and does not arbitrate access by the second port to the non-lockable portion of the plurality of memory cells.

10. The integrated circuit of claim 9 further comprising:
a programmable logic portion coupled to the second port of the memory and comprising a plurality of logic elements programmably configurable to implement user-defined combinatorial or registered logic functions.

11. The integrated circuit of claim 10 further comprising:
an embedded processor portion comprising the memory and an embedded processor bus coupled to the first port of the memory.

12. The integrated circuit of claim 9 wherein when the second port requires access to the lockable portion of the memory, the second port sends a lock request to the arbiter, the arbiter determines whether the first port is accessing the lockable portion of the memory, the arbiter sends a lock grant signal to the second port if the first port is not accessing the lockable portion of the memory, and the arbiter does not send the lock grant signal if the first port is accessing the lockable portion of the memory, and wherein when the second port requires access to the non-lockable portion of the memory, it accesses the non-lockable portion of the memory without sending the lock request to the arbiter.

13. An integrated circuit including a memory comprising:
a first number of lockable memory cells;
a second number of non-lockable memory cells;
a first port coupled to the lockable and non-lockable memory cells;
a second port coupled to the lockable and non-lockable memory cells;
an arbiter coupled to the first port and the second port; and
a variable lock size register coupled to the arbiter, wherein the register stores a user-programmable lock size value,
wherein the first number plus the second number equal a third number, and the first number and second number are variable and determined by the user-programmable lock size value, and wherein the arbiter arbitrates access to the lockable memory cells by the second port and does not arbitrate access to the non-lockable memory cells by the second port.

14. The integrated circuit of claim 13 further comprising:
a programmable logic portion coupled to the second port of the memory and comprising a plurality of logic elements programmably configurable to implement user-defined combinatorial or registered logic functions.

15. The integrated circuit of claim 14 further comprising:
an embedded processor portion comprising the memory and an embedded processor bus coupled to the first port of the memory.

16. The integrated circuit of claim 13 wherein when the second port requires access to the lockable portion of the memory, the second port sends a lock request to the arbiter, the arbiter determines whether the first port is accessing the lockable portion of the memory, the arbiter sends a lock grant signal to the second port if the first port is not accessing the lockable portion of the memory, and the arbiter does not send the lock grant signal if the first port is accessing the lockable portion of the memory, and wherein when the second port requires access to the non-lockable portion of the memory, it accesses the non-lockable portion of the memory without sending the lock request to the arbiter.

17. The integrated circuit of claim 13 wherein the first port and the second port are configurable in size.

18. An integrated circuit including a memory comprising:
a plurality of lockable memory cells;
a plurality of non-lockable memory cells;
a first port coupled to the plurality of lockable memory cells and the plurality of non-lockable memory cells;
a second port coupled to the plurality of lockable memory cells and the plurality of non-lockable memory cells; and
an arbiter coupled to the first port and the second port, the arbiter having a wait output coupled to the first port, and a lock request input and a lock grant output coupled to the second port,
wherein when the first port accesses the plurality of lockable memory cells, if the wait output is inactive, the first port accesses the plurality of lockable memory cells, otherwise the first port waits to access the plurality of lockable memory cells, and
when the second port accesses the first plurality of lockable memory cells, the second port provides a lock request to the lock request input, and when the lock grant output is active, the second port accesses the plurality of lockable memory cells.

19. The integrated circuit of claim 18 wherein the first port can access the plurality of non-lockable memory cells when the wait output is active and the second port can access the plurality of non-lockable memory cells without providing a lock request to the lock request input.

20. The integrated circuit of claim 18 wherein the arbiter further comprises an access input coupled to the first port, and when the first port accesses the plurality of lockable memory cells, the first port provides an access signal to the access input.

21. The integrated circuit of claim 20 further comprising:

a programmable logic portion coupled to the second port of the memory and comprising a plurality of logic elements programmably configurable to implement user-defined combinatorial or registered logic functions.

22. The integrated circuit of claim 21 further comprising:
an embedded processor portion comprising the memory and an embedded processor bus coupled to the first port of the memory.

23. The integrated circuit of claim 18 wherein the second port has a configurable size.

24. The integrated circuit of claim 23 wherein first port has a size that is configurable independent of the size of the second port.

* * * * *